(12) United States Patent
Hsu et al.

(10) Patent No.: US 6,445,638 B1
(45) Date of Patent: Sep. 3, 2002

(54) FOLDED-BITLINE DUAL-PORT DRAM ARCHITECTURE SYSTEM

(75) Inventors: Louis L. Hsu, Fishkill; Rajiv V. Joshi, Yorktown Heights; Radens Carl, Lagrangeville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 225 days.

(21) Appl. No.: 09/665,016

(22) Filed: Sep. 19, 2000

Related U.S. Application Data

(63) Continuation of application No. 09/650,011, filed on Aug. 28, 2000.

(51) Int. Cl.$^7$ .............................................. G11C 13/00
(52) U.S. Cl. ..................................... 365/230.05; 365/63
(58) Field of Search .............................. 365/230.05, 51, 365/63

(56) References Cited

U.S. PATENT DOCUMENTS

| | | | |
|---|---|---|---|
| 5,687,132 A | * 11/1997 | Rao ....................... | 365/230.03 |
| 5,923,593 A | 7/1999 | Hsu et al. .............. | 365/230.05 |
| 5,933,386 A | * 8/1999 | Walker et al. ......... | 365/230.01 |
| 6,049,495 A | * 4/2000 | Hsu et al. .................. | 365/203 |

* cited by examiner

*Primary Examiner*—Son T. Dinh
(74) *Attorney, Agent, or Firm*—Dilworth & Barrese, LLP

(57) ABSTRACT

A dual-port, folded-bitline DRAM architecture system is presented which prioritizes two simultaneous access requests slated for a DRAM cell of a data array prior to performing at least one of the access requests to prevent affecting the integrity of the data while suppressing noise due to wordline-to-bitline coupling, bitline-to-bitline coupling, and bitline-to-substrate coupling. If the two access requests are write-read, the system prioritizes the two access requests as being equal to each other. The system then simultaneously performs the write and read access by accessing the corresponding DRAM cell through the first port to write the data while simultaneously writing the data through to an output bus, which is equivalent to a read access. In another embodiment of the present invention, a dual-port, shared-address bus DRAM architecture system is presented which also prioritizes two simultaneous access requests slated for the DRAM cell of a data array. If the two access requests are write-read or read-write, then the system prioritizes the two access requests as being equal to each other. The system then simultaneously performs the write and read access or the read and write access requests by accessing the corresponding DRAM cell through the first port or second port, respectively, to write the data while simultaneously writing the data through to an output bus.

24 Claims, 9 Drawing Sheets

FOLDED-BITLINE DUAL-PORT DRAM ARCHITECTURE SYSTEM

PRIORITY

This application is a continuation application of an application filed on Aug. 28, 2000 having U.S. application Ser. No. 09/650,011.

FIELD OF THE INVENTION

This invention relates to the field of integrated circuit (IC) design. Specifically, it relates to a folded-bitline dual-port dynamic random access memory (DRAM) architecture system.

BACKGROUND OF THE INVENTION

Each memory cell in a dual-port static random access memory (SRAM) chip is a buffer or flip-flop, and data is retained as long as power is maintained to the chip. SRAMs are realized with a bipolar technology, such as TTL, ECL, or I$^2$L or with MOS technology, such as NMOS or CMOS. Bipolar SRAMs are relatively fast, having access times of 10 to 100 nsec. Power dissipation is also high, typically, 0.1 to 1.0 mW/bit. By contrast, MOS RAM access time is typically 100 nsec and power dissipation is 25 $\mu$W/bit. The combination of high circuit density, low power dissipation, and reasonable access time has led to the dominance of MOS technology in the manufacture of RAM. Hence, dual-port SRAMs having high-speed buffers are widely used in devices and equipment necessitating high-speed and high performance, such as microprocessors, communication networks, facsimile machines, modems, etc.

Since the memory cells of SRAMs take up a relatively large surface area on a single integrated (IC) chip, IC design engineers, in an effort to increase the number of memory cells on the IC chip and make the chip smaller, have focused on improving dynamic RAM (DRAM) chips to make them suitable for high-speed, high performance devices and equipment. Currently, the ultimate in compactness, is a single-port DRAM chip where each memory cell uses a capacitor to store a charge and one transistor to gate it to sense amplifier circuits as shown by the prior art DRAM cell 10 of FIG. 1.

The DRAM cell 10 includes an access transistor 12, a storage capacitor 14, a bitline 16 and a wordline 18. During a write access, a wordline enable signal is asserted on wordline 18 thereby turning on transistor 12. A data signal is provided on bitline 16. This signal is routed through transistor 12 and stored in capacitor 14. During a read access, a wordline enable signal is asserted on wordline 18 to turn on transistor 12. The data signal stored in capacitor 14 is routed to bitline 16 through transistor 12. This data signal is amplified by a sense amplifier circuit (not shown) and then provided to the device initiating the read access.

A disadvantage of the single-port DRAM cell 10 is that it does not enable multi-port access, where more than one port can be accessed for simultaneously enabling reading, writing and/or refreshing of the memory cell. Multi-port access is required if the DRAM chip is to compete with or surpass the SRAM chip in terms of high-speed and high performance, while being simple and compact. Further, the single-port DRAM cell 10 has two additional disadvantage common to all types of DRAM cells. That is, the charge of each DRAM cell must be restored after the cell is read, and the charge in every cell must be refreshed periodically by periphery refresh circuitry.

Hence, the data rate, in terms of data access time and refresh cycle time, is low for a DRAM chip which prevents IC design engineers from implementing DRAM chips in devices and equipment requiring high-speed and high performance, such as microprocessors and communication networks. It is therefore a goal of IC design engineers to design a dual-port DRAM architecture system which can simultaneously perform two data access requests slated for a DRAM cell for increasing the data array's data rate while maintaining its compactness. Such a DRAM architecture system would be a better design choice over an SRAM architecture system for devices and equipment necessitating high-speed and high performance.

A dual-port DRAM cell is described in U.S. Pat. No. 5,923,593. The dual-port DRAM cell as shown by FIG. 4 in the patent is designed for staggering the read accesses. That is, during the first half of a clock cycle the first port is accessed and during the second half of the clock cycle the second port is accessed. In a similar manner, write accesses can be staggered. That is, during the first half of the clock cycle, the first port is accessed for writing to a cell and during the second half of the clock cycle, the second port is accessed for writing to the same or a different cell. However, as noted in the patent, such a "simultaneous" write access results in an indeterminate data value being written to the DRAM cells which affects the integrity of the data.

For example, if in the first half of the clock cycle, a logic "one" is written into a cell while a logic "one" is latched into the sense amplifier circuit, the same row can be accessed through the second port during the second half of the clock cycle for writing a logic "zero". At this moment, due to charge sharing between the first sense amplifier circuit and the second sense amplifier circuit, the resulting charge stored in that cell will be in between "one" and "zero" and the data in the cell has an indeterminate data value. Similarly, a read-write access could also result in the same situation. For example, if a DRAM cell is originally stored with a logic "zero", after a read out operation through the first port during the first half of the clock cycle, a logic "zero" is latched in the first sense amplifier circuit. If the same row is accessed through the second port during the second half of the clock cycle, and is written with a logic "one", the data in the cell will again have an indeterminate data value due to charge sharing between the first sense amplifier circuit and the second sense amplifier circuit.

Additionally, the dual-port DRAM architecture system described in U.S. Pat. No. 5,923,593 is the classical open-bitline architecture system which is known to be susceptible to noise problems due to wordline-to-bitline coupling, bitline-to-bitline coupling, and bitline-to-substrate (or well) coupling which are well known in the DRAM industry. In an effort to mitigate the noise problems, the patent discloses the use of a dummy wordline swing in the adjacent array, as well as placing a dummy load in the edge array. However, with such a design configuration, the array size is significantly increased and operation of the dual-port DRAM becomes more complex.

SUMMARY

An objective of the present invention is to provide a dual-port DRAM architecture system for overcoming the disadvantages of the prior art.

Another objective of the present invention is to provide a dual-port DRAM architecture system for simultaneously performing two access requests slated for a DRAM cell without affecting the integrity of the data.

Further, another objective of the present invention is to provide a dual-port DRAM architecture system for prioritizing two simultaneous access requests slated for a DRAM cell.

Further still, another objective of the present invention is to provide a dual-port DRAM architecture system for suppressing noise due to wordline-to-bitline coupling, bitline-to-bitline coupling, and bitline-to-substrate coupling.

Accordingly, in an embodiment of the present invention, a dual-port, folded-bitline DRAM architecture system is presented which prioritizes two simultaneous access requests slated for a DRAM cell of a data array prior to performing at least one of the access requests to prevent affecting the integrity of the data while suppressing noise due to wordline-to-bitline coupling, bitline-to-bitline coupling, and bitline-to-substrate coupling. If the two access requests are read-refresh, read-read or write-refresh, where the first access request is slated through a first port and the second access request is slated through a second port of a corresponding DRAM cell of the data array, the system prioritizes the access request slated through the first port at a higher priority than the access request slated through the second port. The system thus cancels the access request slated through the second port. If the two access requests are write-read, the system prioritizes the two access requests as being equal to each other. The system then simultaneously performs the write and read access by accessing the corresponding DRAM cell through the first port to write the data while simultaneously writing the data through to an output bus, which is equivalent to a read access.

In another embodiment of the present invention, a dual-port, shared-address bus DRAM architecture system is presented which can perform two access requests in a staggered manner. That is, in a first half of a clock cycle, a DRAM cell is accessed through a first port to perform a first access request and in a second half of the clock cycle, the DRAM cell is accessed through a second port to perform a second access request.

Similarly to the folded-bitline DRAM architecture system, this system also prioritizes two simultaneous access requests slated for the DRAM cell of a data array. If the two access requests are read-refresh, read-read or write-refresh, where the first access request is slated through the first port and the second access request is slated through the second port of a corresponding DRAM cell of the data array, the system prioritizes the access request slated through the first port at a higher priority than the access request slated through the second port. The system thus cancels the access request slated through the second port.

If the two access requests are write-read or read-write, the system prioritizes the two access requests as being equal to each other. The system then simultaneously performs the write and read access or the read and write access requests by accessing the corresponding DRAM cell through the first port or second port, respectively, to write the data while simultaneously writing the data through to an output bus, which is equivalent to a read access. If the two access requests are write-write, the system prioritizes the write access request slated through the second port at a higher priority than the write access request slated through the first port. The system thus cancels the write access request slated through the first port.

This system further includes shared-address buses, thereby enabling control circuitry to be shared by both ports, since only one port of the corresponding DRAM cell can be used at a time due to staggering access requests. Hence, less control circuitry is required and all of the control circuitry can be provided at one side of the data array. Accordingly, the fabrication cost and the amount of surface area used in implementing the system are decreased.

Prioritization is realized, in order to maintain data integrity in both DRAM architecture systems, by designating one port of each DRAM cell a master port and the other port a slave port, where the access request slated through the master port has typically a higher priority than the access request slated through the slave port. Accordingly, accesses to the DRAM cell through the master port, with some exceptions, take precedence over accesses through the slave port.

Each DRAM architecture system suppresses noise due to wordline-to-bitline coupling, bitline-to-bitline coupling, and bitline-to-substrate coupling by providing at least a complementary bitline on the data array for each true bitline to form bitline pairs.

DETAILED DESCRIPTION OF THE INVENTION

Figure 1:
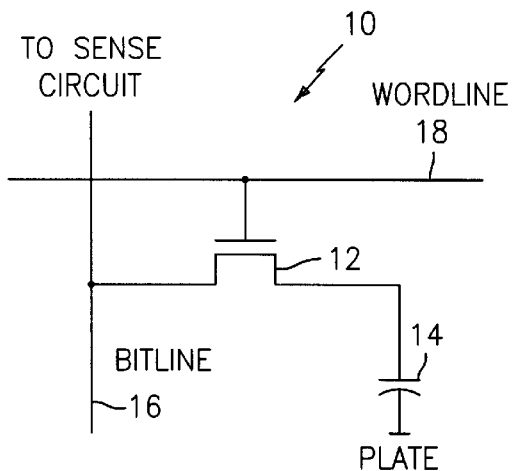
FIG. 1 is a schematic diagram of a prior art single-port DRAM cell.

The present invention provides a dual-port, folded-bitline DRAM architecture system which prioritizes two simultaneous access requests slated for a DRAM cell of a data array prior to performing at least one of the access requests to prevent affecting the integrity of the data while suppressing noise due to wordline-to-bitline coupling, bitline-to-bitline coupling, and bitline-to-substrate coupling. If the two access requests are read-refresh, read-read or write-refresh, where the first access request is slated through a first port and the second access request is slated through a second port of a corresponding DRAM cell of the data array, the system prioritizes the access request slated through the first port at a higher priority than the access request slated through the second port. The system thus cancels the access request slated through the second port. If the two access requests are write-read, the system prioritizes the two access requests as being equal to each other. The system then simultaneously performs the write and read access by accessing the corresponding DRAM cell through the first port to write the data while simultaneously writing the data through to an output bus, which is equivalent to a read access.

In another embodiment of the present invention, a dual-port, shared-address bus DRAM architecture system is presented which can perform two access requests in a staggered manner. That is, in a first half of a clock cycle, a DRAM cell is accessed through a first port to perform a first access request and in a second half of the clock cycle, the DRAM cell is accessed through a second port to perform a second access request.

Similarly to the folded-bitline DRAM architecture system, this system also prioritizes two simultaneous access requests slated for the DRAM cell of a data array. If the two access requests are read-refresh, read-read or write-refresh, where the first access request is slated through the first port and the second access request is slated through the second port of a corresponding DRAM cell of the data array, the system prioritizes the access request slated through the first port at a higher priority than the access request slated through the second port. The system thus cancels the access request slated through the second port.

If the two access requests are write-read or read-write, the system prioritizes the two access requests as being equal to each other. The system then simultaneously performs the write and read access or the read and write access requests by accessing the corresponding DRAM cell through the first port or second port, respectively, to write the data while simultaneously writing the data through to an output bus, which is equivalent to a read access. If the two access requests are write-write, the system prioritizes the write access request slated through the second port at a higher priority than the write access request slated through the first port. The system thus cancels the write access request slated through the first port.

This system further includes shared-address buses, thereby enabling control circuitry to be shared by both ports, since only one port of the corresponding DRAM cell can be used at a time. Hence, less control circuitry is required and all of the control circuitry can be provided at one side of the data array. Accordingly, the fabrication cost and the amount of surface area used in implementing the system are decreased.

Prioritization is realized, in order to maintain data integrity in both DRAM architecture systems, by designating one port of each DRAM cell a master port and the other port a slave port, where the access request slated through the master port has typically a higher priority than the access request slated through the slave port. Accordingly, accesses to the DRAM cell through the master port, with some exceptions, take precedence over accesses through the slave port.

Each DRAM architecture system suppresses noise due to wordline-to-bitline coupling, bitline-to-bitline coupling, and bitline-to-substrate coupling by providing at least a complementary bitline on the data array for each true bitline to form bitline pairs.

In a first section of this disclosure, the dual-port, folded-bitline DRAM architecture system is described. In a subsequent section, the dual-port, shared-address bus DRAM architecture system is described.

I. Dual-port, Folded-Bitline DRAM Architecture System

A. System Configuration and Suppressing Noise Due to the Coupling Effect

Unlike the prior art dual-port DRAM architecture systems, the dual-port, folded-bitline DRAM architecture system of the present invention is capable of suppressing noise due to several reasons. First, when one wordline is activated, it couples up both true and complementary bitlines, i.e., a pair of bitlines, by the same amount. This is due to the fact that both true and complementary bitlines have identical loads and identical wordline-to-bitline coupling capacitance. As a result, the voltage level difference between the true and complementary bitlines does not change by the coupling effect during operation of the dual-port, folded-bitline DRAM architecture system, which prevents noise from building up due to wordline-to-bitline coupling.

Second, the dual-port, folded-bitline DRAM architecture system of the present invention, completely cancels out bitline-to-bitline coupling by providing a bitline-twist configuration as known in the art for a single-port DRAM architecture system, since under all circumstances, any bitline will always have its paired twisted-bitline(s) to completely cancel the bitline-to-bitline coupling effect.

On the contrary, in the open-bitline DRAM architecture system of the prior art, there is no canceling out of the bitline-to-bitline coupling effect, because there is no pairing of bitlines. In the open-bitline system, the worst case is when there is one falling bitline among two adjacent rising bitlines, or, one rising bitline among two adjacent falling bitlines. This single rising or falling bitline experiences the worst bitline-to-bitline coupling effect. The data signal transmitted via this bitline is thereby, significantly weakened.

Third, during operation of the dual-port, folded-bitline DRAM architecture system, and especially, during signal amplification by the sense amplifier circuits, one bitline of the pair of bitlines always rises up to the supply voltage or Vdd and the other bitline of the pair of bitlines falls down to ground. At this moment, the over-all bitline-to-substrate coupling effect is theoretically canceled out.

On the contrary, in the open-bitline DRAM architecture system of the prior art, there is no canceling out of the bitline-to-substrate coupling effect, because there is no pairing of bitlines. The worst bitline-to-substrate coupling effect case for the open-bitline DRAM architecture system is when the whole array of bitlines rises up to Vdd, and thus the substrate of the active array is coupled up. This causes unnecessary cell leakage caused by threshold lowering of the transfer devices due to substrate voltage rising within the substrate which gives rise to noise.

To counteract the bitline-to-substrate coupling effect, the dual-port, open-bitline DRAM architecture system disclosed by U.S. Pat. No. 5,923,593 provides an adjacent reference or dummy array. As the substrate of the active array is coupled up, the substrate of the adjacent reference array is coupled down to cancel out the overall bitline-to-substrate coupling effect. This design configuration requires more components which increase the fabrication cost and the surface area utilized.

Figure 2:
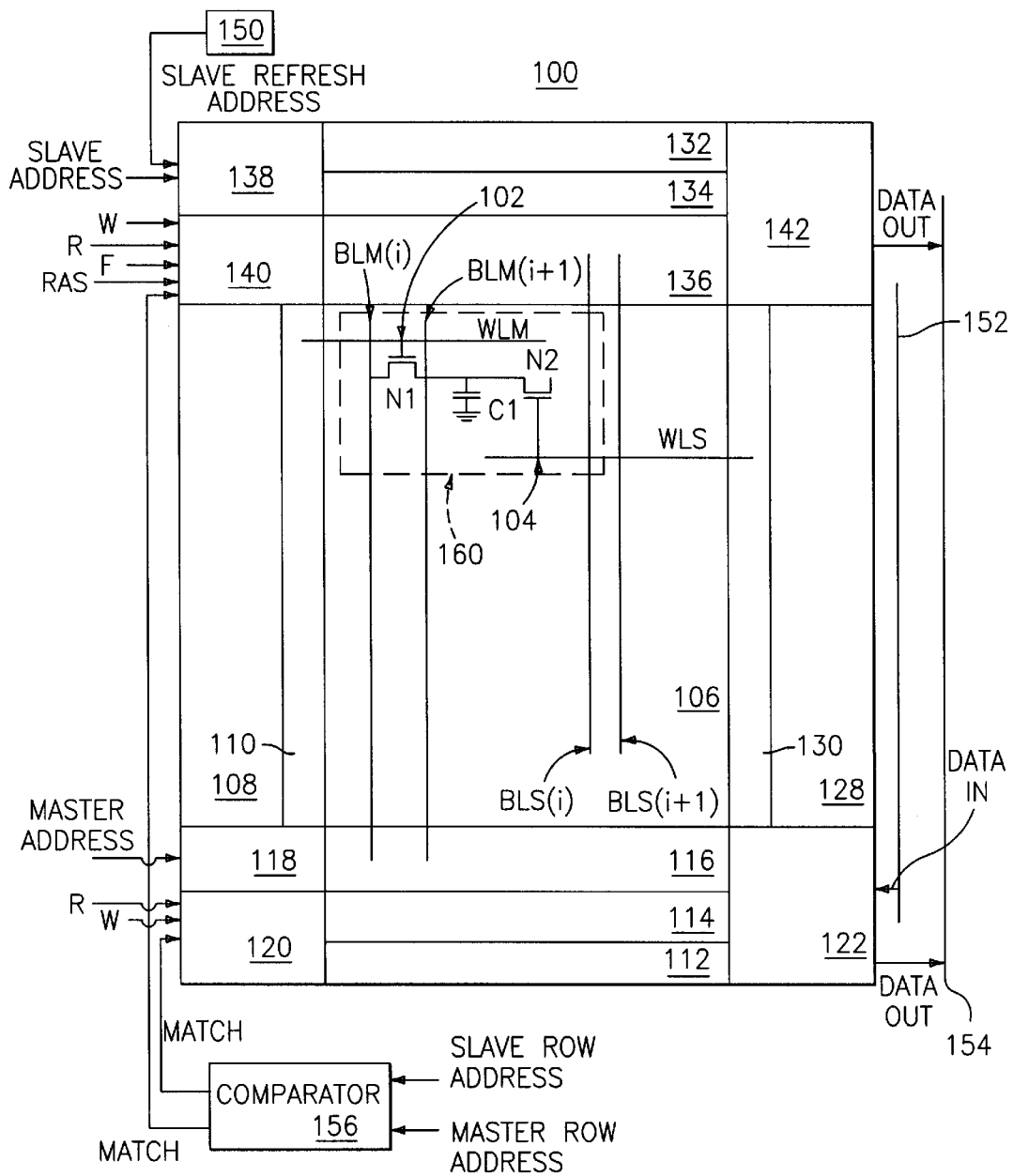
FIG. 2 is a diagram of a dual-port, folded-bitline DRAM architecture system according to the present invention.

With reference to FIG. 2, there is shown the dual-port, folded-bitline DRAM architecture system of the present invention, which is designated generally by reference numeral 100. Each DRAM cell of the system 100, including the DRAM cell 160 shown by FIG. 2, is a dual-port DRAM cell, i.e., it contains a master port 102 and a slave port 104. Since each DRAM cell is a dual-port DRAM cell, it contains two transfer transistors N1 and N2, and one storage capacitor C1.

The components for driving the master port 102 are located to the left of a data array 106. The components for driving the slave port 104 are located to the right of the data array 106. The master port components are a master row decoder 108, a master wordline driver 110, a master column decoder 112, a master I/O switch 114, a master sense amplifier circuit 116, a master row/column address buffer 118, a master port control circuit 120, and an I/O buffer 122. The structure and operation of all of the components of the master port 102 and their inter-connections are known in the art, except for the master port control circuit 120 which controls access through the master port 102. The master port control circuit 120 is described in detail below with reference to FIG. 6.

The slave port components are a slave row decoder 128, a slave wordline driver 130, a slave column decoder 132, a slave I/O switch 134, a slave sense amplifier circuit 136, a slave row/column address buffer 138, a slave port control circuit 140, and an output buffer 142. Unlike the master port 102 which is used to perform read and write accesses and hence, warrants the need for an I/O buffer, the slave port 104 is only used to perform refresh and read accesses, and therefore, only an output buffer is needed for the slave port 104. The structure and operation of all of the components of the slave port 104 and their inter-connections are known in the art, except for the slave port control circuit 140 which controls access through the slave port 104. The slave port control circuit 140 is described in detail below with reference to FIG. 5.

The system 100 further includes a refresh address generator 150 which generates a slave refresh address. The slave refresh address is transmitted to the slave row/column address buffer 138. The slave refresh address indicates typically the row address of the DRAM cell which requires refreshing, in order for that DRAM cell to be refreshed through the slave port 104.

One refresh method is a burst refresh. A refresh counter of the refresh address generator 150 activates a wordline at a time to refresh the DRAM cells in a particular row of the array 106 until all the DRAM cells in the array 106 are refreshed as known in the art. The counter then waits for a refresh clock to clock a subsequent refresh cycle.

The burst refresh access can be described as being hidden, since the refresh address generator 150 is not controlled by external circuitry, such as an external processor. It is mainly designed to perform independent refresh accesses to restore charges after a read access or after the charges have leaked off from the DRAM cells.

Hence, the external processor is unaware when a refresh access is in process through the slave port 104. The external processor is only programmed to be aware that only the master port 102 of each DRAM cell in the data array 106 is always available for read and write accesses, and the slave port 104 is sometimes available for read accesses.

When the slave port 104 is not being operated in a refresh mode, the slave refresh address is transmitted to the slave row/column address buffer 138 and it is stored therein. When the system 100 operates in the refresh mode, the slave refresh address is read and the DRAM cell corresponding to the slave refresh address is refreshed through the slave port 104, as further described below.

A slave port control signal RAS determines the operating mode of the slave port 104, i.e., whether the slave port 104 is to be operated in the refresh mode or read mode, as described below. The slave port control signal RAS is generated and transmitted to the slave port control circuit 140 by external circuitry, such as a memory controller or processor.

The system 100 further includes master bitlines BLM and slave bitlines BLS coupling the master port 102 and slave port 104, respectively, of each dual-port DRAM cell (one DRAM cell 160 is shown by FIG. 2) of the data array 106 to the master sense amplifier circuit 116 and the slave sense amplifier circuit 136, respectively. Each bitline includes an adjacent, non-active bitline for realizing the folded-bitline architecture to suppress noise due to the coupling effect.

Two pairs of complementary bitlines BLS are shown by FIG. 2, i.e., BLM(i), BLM(i+1) and BLS(i), BLS(i+1). The first two bitlines BLM(i), BLM(i+1) are the master bitlines and are grouped as the first pair feeding into the master sense amplifier circuit 116, while the second two bitlines BLS(i), BLS(i+1) are the slave bitlines and are grouped as the second pair feeding into the slave sense amplifier circuit 136.

Further, the system 100 includes a corresponding master wordline WLM and slave wordline WLS connecting the dual-port DRAM cell 160 of the data array 106 to the master wordline driver 110 and the slave wordline driver 130, respectively, as known in conventional DRAM circuit design. The master port 102 is accessed from the first wordline WLM while the slave port 104 is accessed from the second wordline WLS according to traffic control rules of the present invention outlined in the following sub-section. Finally, the system 100 includes data input and data output lines 152, 154, in order for the system 100 to communicate with external devices by receiving and transmitting data as known in the art.

Figure 3A:
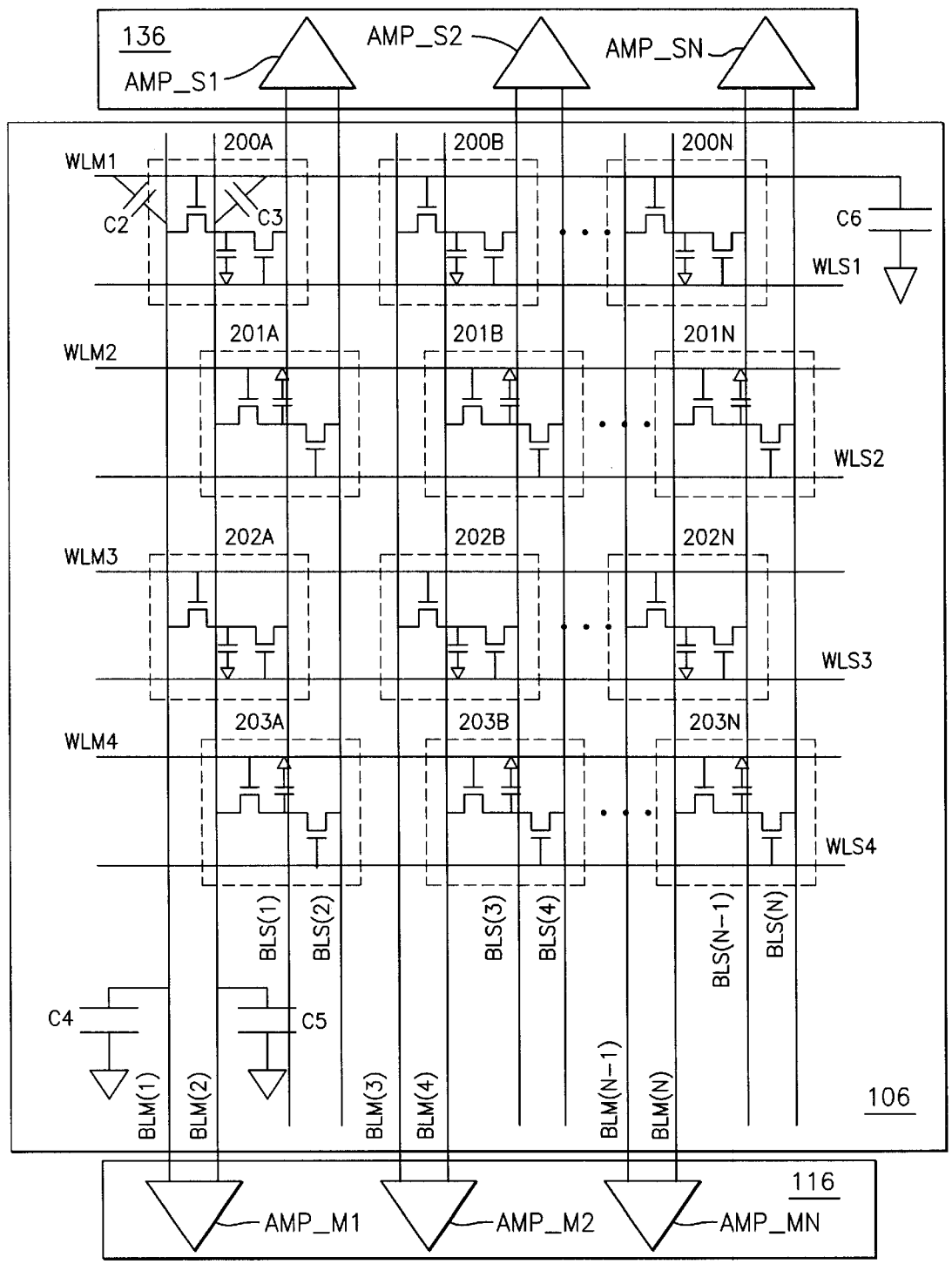
FIG. 3A is a diagram of a first dual-port DRAM data array arrangement for the dual-port, folded-bitline DRAM architecture system of FIG. 2.

With reference to FIG. 3A, the grouping of the bitlines into pairs in accordance with the present invention is further illustrated as the data array 106 is shown in greater detail. The data array 106 includes four rows and N columns for a total of 4×N DRAM cells. It is contemplated that the data array 106 can have any number of rows and columns of DRAM cells with the appropriate number of wordlines and bitlines.

The first pair of bitlines BLM(1), BLM(2), the third pair of bitlines BLM(3), BLM(4), and the N−1th pair of bitlines BLM(N−1), BLM(N) are master bitline pairs; the second pair of bitlines BLS(1), BLS(2), the fourth pair of bitlines BLS(3), BLS(4), and the Nth pair of bitlines BLS(N−1), BLS(N) are slave bitline pairs. Each of the master bitline pairs are fed to a corresponding amplifier AMP_M1, AMP_M2, AMP_MN within the master sense amplifier circuit 116; the slave bitline pairs are fed to a corresponding amplifier AMP_S1, AMP_S2, AMP_SN within the slave sense amplifier circuit 136. The data array 106 further includes four master wordlines WLM1–WLM4 and four slave wordlines WLS1–WLS4.

Further, each DRAM cell 200A–203N has a pair of parasitic capacitors, such as C2 and C3 shown for DRAM cell 200A. One of the parasitic capacitors connects a true bitline to a wordline and the other parasitic capacitor connects the true bitline's complementary bitline to the same wordline. Hence, the parasitic capacitors are the wordline-to-bitline pair coupling capacitors. The true and complementary bitlines have approximately equal loads, i.e., the bitlines are connected to the same number of devices, and approximately equal wordine-to-bitline coupling capacitance. The preferred capacitance range for the parasitic capacitors C2, C3 is approximately 10 fentofards.

Hence, it has been demonstrated that the parasitic capacitors C2, C3 prevent the voltage level difference between the true and complementary bitlines from changing, i.e., the voltage level of the true bitline is increased while the voltage level of the complementary bitline is decreased, due to the wordline-to-bitline coupling effect during a wordline activation period, thereby suppressing noise which is created due to this effect. That is, for example, when the wordline WLM1 is activated for performing an operation within DRAM cell 200A as known in the art, the wordline WLM1 couples up, i.e., brings to a higher voltage level, both the true bitline BLM(1) and its complementary bitline BLM(2) by the same voltage amount due to an increase in the voltage potential of the parasitic capacitors C2, C3, thereby the net effect due to wordline-to-bitline coupling is canceled. As a result, noise created by the wordline-to-bitline coupling effect is significantly suppressed.

In the open-bitline DRAM architecture system of the prior art, when a wordline's voltage level rises during a signal developing period, one of the bitlines is coupled up, i.e., its voltage level is increased. However, its complementary bitline which is connected to the dummy array is coupled down, i.e., its voltage level is decreased. Accordingly, noise created by the wordline-to-bitline coupling effect is not suppressed in the open-bitline system.

Noise created by the bitline-to-substrate coupling effect during the signal developing period and a signal sensing period has also been shown to be significantly suppressed by the dual-port, folded-bitline DRAM architecture system 100 of the present invention. During signal amplification, within a pair of bitlines, by an amplifier within the master sense amplifier circuit 116 and the slave sense amplifier circuit 136, the true bitline will always rise up to Vdd and its complementary bitline will fall down to ground. Hence, when the true bitline rises to Vdd, it couples the substrate up to Vdd due to bitline-to-substrate capacitance, i.e., a voltage potential between the true bitline and ground. Similarly, when its complementary bitline drops to ground, it couples the substrate down to ground due to bitline-to-substrate capacitance, and the overall bitline-to-substrate coupling effect is canceled out. As a result, noise created by the bitline-to-substrate coupling effect is significantly suppressed.

It is noted that sometimes the bitline will not rise up to Vdd, but to a voltage level less than Vdd; also, sometimes the other bitline will not fall down to ground, but to a higher voltage level than ground. However, for simplicity, Vdd and ground are used herein.

Further, each pair of bitlines has at least a pair of parasitic capacitors, such as C4 and C5 shown for bitline pair BLM(1), BLM(2), having approximately the same capacitance. The preferred capacitance for the parasitic capacitors C4 and C5 is in the range of 30–60 fentofarads. One of these parasitic capacitors reflects the capacitance of the true bitline and the other parasitic capacitor reflects the capacitance of the complementary bitline.

Figure 3B:
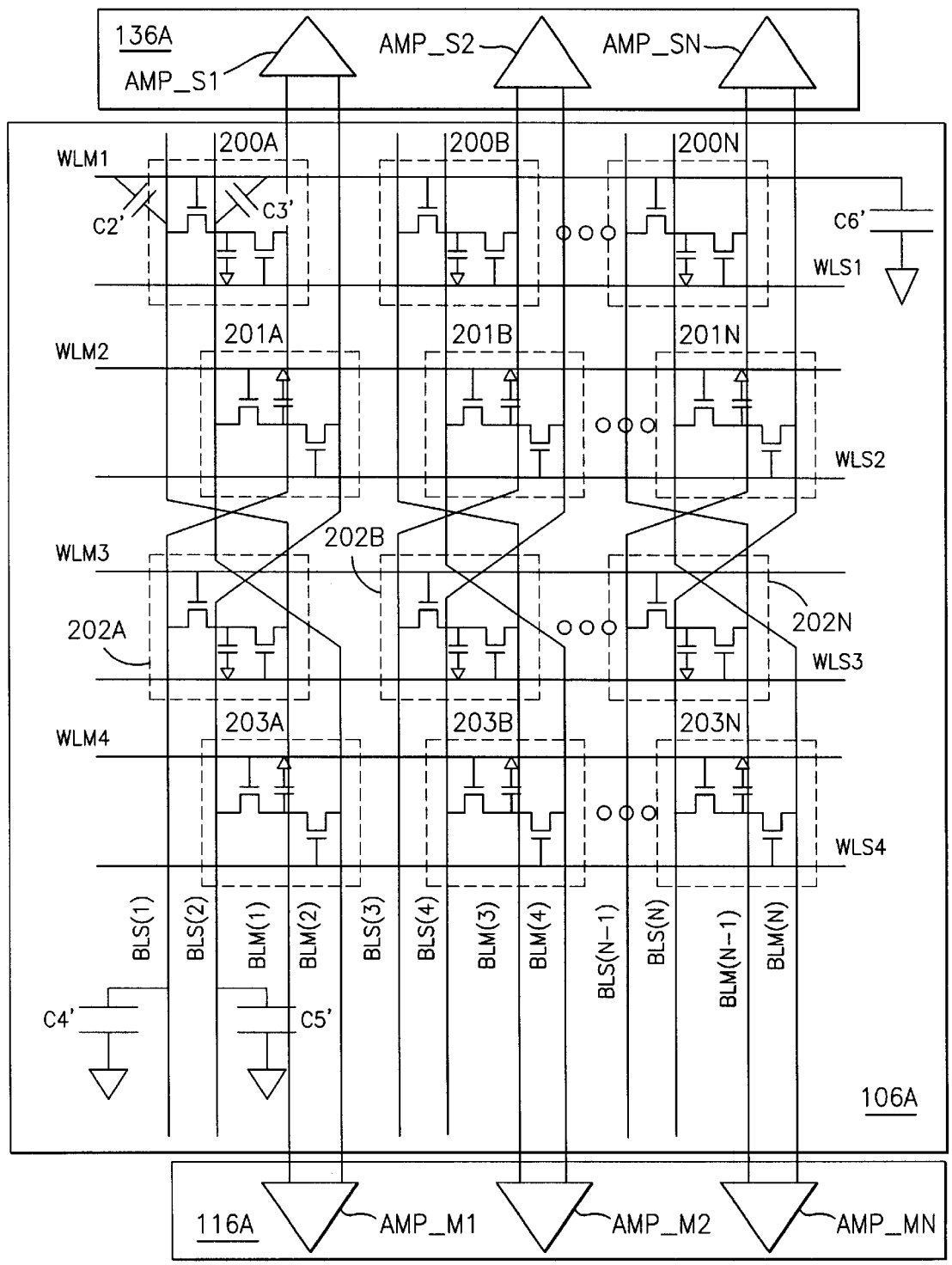
FIG. 3B is a diagram of a second dual-port DRAM data array arrangement for the dual-port, folded-bitline DRAM architecture system of FIG. 2.

With reference to FIG. 3B, in order to cancel the net effect due to bitline-to-bitline coupling, the bitlines need to be arranged in a bitline-twist configuration as illustrated by dual-port, folded-bitline DRAM data array 106A. Similarly to parasitic capacitors C4 and C5 for DRAM array 106, parasitic capacitors C4' and C5' for DRAM array 106A have equal capacitance. Therefore, as it has been demonstrated, each true bitline will be either rising or falling during a DRAM cell operation and its complementary bitline will be doing the opposite, thereby the net effect due to bitline-to-bitline coupling is canceled. As a result, noise created by the bitline-to-bitline coupling effect is significantly suppressed.

Figure 3C:
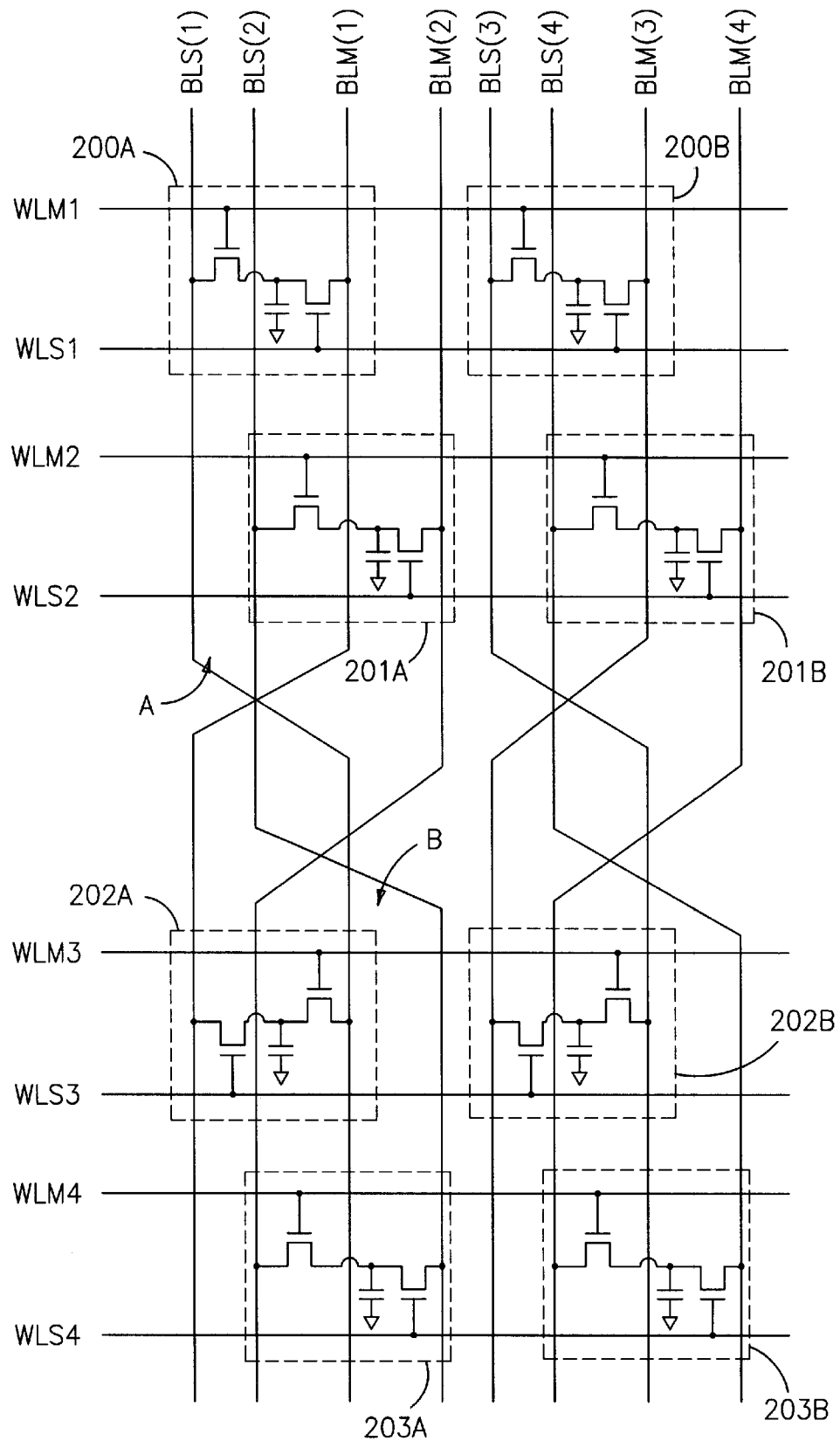
FIG. 3C is an enlarged view of a portion of FIG. 3B.

For example, as shown by FIG. 3C which depicts a portion of DRAM array 106A of FIG. 3B, as the true bitline rises to approximately Vdd during operation of the memory system, its complementary bitline drops to ground, and vice versa, thereby canceling any bitline-to-bitline coupling. Consequently, noise attributed to bitline-to-bitline coupling is suppressed.

The bitline is either brought up to approximately Vdd from ½ Vdd or brought down to ground from ½ Vdd during the signal sensing period due to at least a pre-charge circuit within the master and slave sense amplifiers 116A, 136A, as known in the art. Accordingly, the voltage potential, i.e., parasitic capacitance, between each pair of bitlines, for example, between true bitline BLS(1) and its complementary bitline BLS(2) in FIG. 3C at point A during the signal developing period and the signal sensing period, rises from ½ Vdd to approximately Vdd and also drops from ½ Vdd to ground, for example, at point B in FIG. 3C. Hence, bitline-to-bitline coupling is canceled, thereby suppressing noise due to such coupling.

The data array 106A includes four rows and N columns for a total of 4×N DRAM cells. It is contemplated that the data array 106A can have any number of rows and columns of DRAM cells with the appropriate number of wordlines and bitlines.

The second pair of bitlines BLM(1), BLM(2), the fourth pair of bitlines BLM(3), BLM(4), and the Nth pair of bitlines BLM(N–1), BLM(N) are master bitline pairs; the first pair of bitlines BLS(1), BLS(2), the third pair of bitlines BLS(3), BLS(4), and the N–1th pair of bitlines BLS(N–1), BLS(N) are slave bitline pairs. Each of the master bitline pairs are fed to a corresponding amplifier AMP_M1, AMP_M2, AMP_MN within the master sense amplifier circuit 116A; the slave bitline pairs are fed to a corresponding amplifier AMP_S 1, AMP_S2, AMP_SN within the slave sense amplifier circuit 136A. The data array 106A further includes four master wordlines WLM1–WLM4 and four slave wordlines WLS1–WLS4.

It is contemplated that each bitline is twisted more than once for DRAM arrays having more than four rows. For example, for a DRAM array having six rows, each bitline will be twisted two times, and for a DRAM array having ten rows, each bitline will be twisted four times.

Similarly to DRAM array 106, each DRAM cell 200A–203N has a pair of parasitic capacitors, such as C2' and C3' shown for DRAM cell 200A. One of the parasitic capacitors connects a true bitline to a wordline and the other parasitic capacitor connects the true bitline's complementary bitline to the same wordline. Hence, as described above, these parasitic capacitors are the wordline-to-bitline pair coupling capacitors. The true and complementary bitlines have approximately equal loads, i.e., the bitlines are connected to the same number of devices, and approximately equal wordine-to-bitline coupling capacitance. The preferred capacitance range for the parasitic capacitors C2', C3' is approximately 10 fentofarads.

As indicated above, each pair of bitlines also has a pair of parasitic capacitors, i.e., capacitors C4' and C5' shown for bitline pair BLS(1), BLS(2), having approximately the same capacitance. The preferred capacitance for the parasitic capacitors C4' and C5' is in the range of 30–60 fentofards.

One of these parasitic capacitors reflects the capacitance of the true bitline and the other parasitic capacitor reflects the capacitance of the complementary bitline.

It is preferred that the system 100 includes the DRAM array 106A for maximum suppression of noise due to the coupling effect, since DRAM array 106A is designed to suppress noise due to wordline-to-bitline coupling and bitline-to-substrate coupling as described with reference to FIG. 3A, as well as bitline-to-bitline coupling, whereas DRAM array 106 is designed to suppress noise due to wordline-to-bitline coupling and bitline-to-substrate coupling only.

Additionally, each wordline, in both DRAM arrays 106 and 106A, includes a parasitic capacitor, such as C6 for DRAM array 106 and C6' for DRAM array 106A for wordline WLM1. The parasitic capacitors C6 and C6' represent the wordline capacitance or voltage potential between a particular wordline and ground. The parasitic capacitors C6 and C6' have a preferred capacitance of approximately one picofarad. It is noted that all of the parasitic capacitors, i.e., C2–C6 for DRAM array 106 and C2'–C6' for DRAM array 106A, are realized due to wiring, gate oxide of the devices, etc.

Additionally, the system 100 includes a comparator 156, as further described below, for determining simultaneous access requests through the master port 104 and slave port 102 of a DRAM cell within the data array 106, such as the DRAM cell 160.

B. Maintaining Data Integrity

A description will now be made as to the operation of the dual-port, folded bitline DRAM architecture system 100 with reference to FIGS. 4–7, and especially how the system 100 maintains data integrity. In order to maintain data integrity, the accessing of the same wordline from two ports of a DRAM cell should be avoided. However, in theory, for a dual-port DRAM, both ports should be freely accessible to improve performance and data processing speed. The key of the present invention is a built-in traffic control logic system to handle any possible address collisions which occur when an attempt is made to simultaneously access a DRAM cell through both ports.

Figure 4:
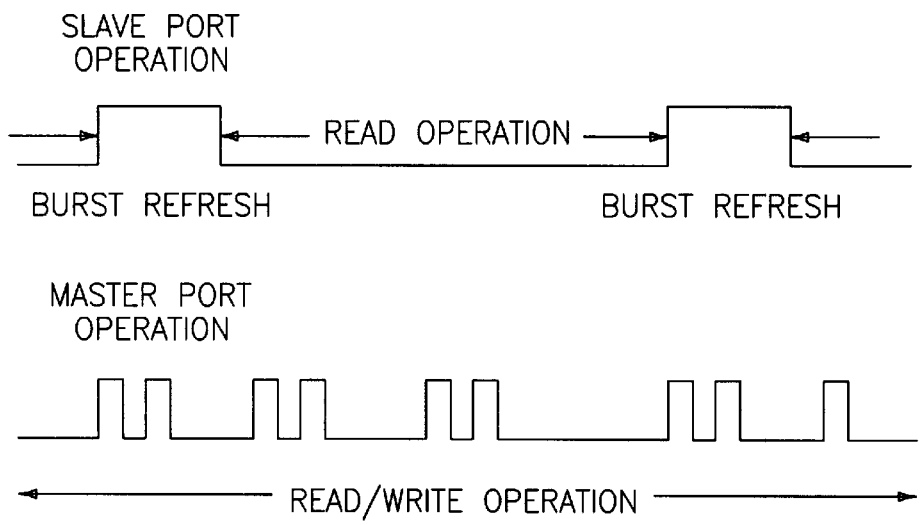
FIG. 4 is a waveform diagram of the operation of a master and a slave port of the dual-port, folded-bitline DRAM architecture system of FIG. 2.

With reference to the waveform diagrams of FIG. 4, during the refresh mode, e.g., at a time when a burst (or distributed refresh) access occurs, the slave port 104 is not available. When the slave port 104 is not in the refresh mode, the slave port 104 becomes available for a read access only. A read or write access can be performed by the master port 102 at any time. A write access can only be performed through the master port 102.

Accordingly, the dual-port, folded bitline DRAM architecture system 100 can be described as behaving like an SRAM architecture system, because like the SRAM system, one port is always randomly accessible for a read or write access, while a refresh access is hidden, i.e., the refresh access can be performed at any time without requiring a specific refresh request from external circuitry, such as an external processor. However, the performance of the dual-port, folded bitline DRAM architecture system 100 is generally better than the single-port SRAM architecture system. For example, if the cycle time of the single-port SRAM is less than two times faster than the dual-port, folded-bitline DRAM architecture system 100, then by using the dual-port DRAM system 100 the data rate will be equivalent or better than using the single-port SRAM.

The master port and slave port control circuits 120, 140 for the dual-port, folded-bitline DRAM architecture system 100 are designed to operate according to the following four traffic rules:

1. If a DRAM cell is accessed via a wordline through either the master port 102 or slave port 104 for a read access, then following the read access, the DRAM cell is automatically refreshed. Therefore, there is no need to perform a refresh access for that particular wordline anymore, and a simultaneous refresh request slated through the slave port 102 is canceled. Also, if the DRAM cell is accessed via the wordline through the master port 102 for a write access, a simultaneous refresh request slated through the slave port 104 on the same wordline is also canceled;

2. If the DRAM cell is accessed via two ports of the same row address wordlines for simultaneously performing write and read operations based upon a write access request slated through the master port 540 and a read access request slated through the slave port 536, it is always desirable, that the most recent data written in the DRAM cell is read out. Therefore, the data is written to the DRAM cell through the master port 102, since, as indicated above, data can only be written to the DRAM cell through the master port 102. While the data is being written to the DRAM cell, the system 100 writes the data through to the output data bus 154 via at least the I/O buffer 122 which is equivalent to a read operation. That is, as the data is received by the I/O buffer 122 via the input data bus 152, if the data is to be written to the output data bus 154, the I/O buffer 122 transmits the data to the output data bus 154 while simultaneously transmitting the data to the DRAM cell. Accordingly, the data is simultaneously written to the DRAM cell and to the data bus 154 to satisfy the write and read requests. Since the read request is satisfied, the read request slated through the slave port 104 is canceled;

3. If the DRAM cell is accessed via two ports of the same row address wordlines for two simultaneous read operations, the read request slated through the slave port 104 is ignored, since one read operation is adequate; and 4. Since a write access is not possible through the slave port 104 (a write access can only be performed through the master port 102), there can be no write-write address collisions.

Figure 5:
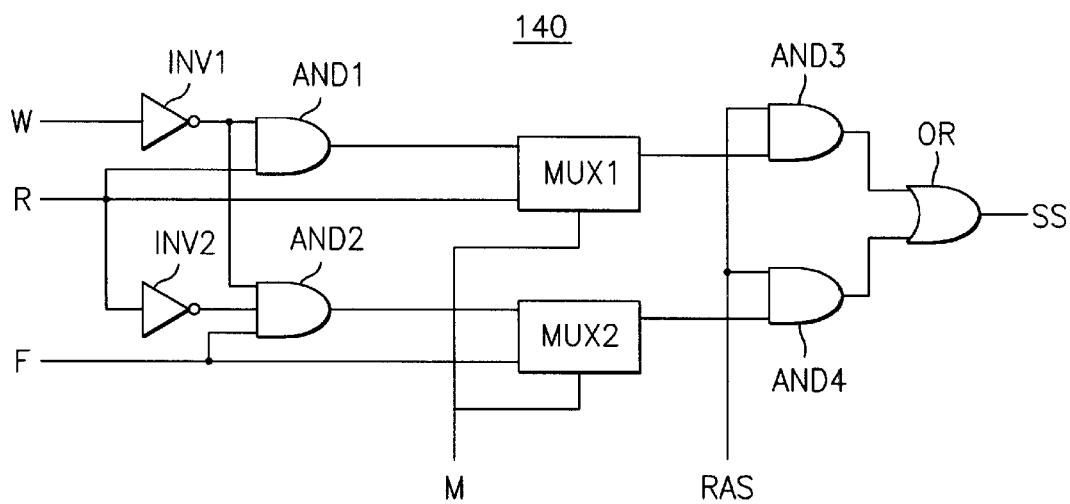
FIG. 5 is a schematic diagram of a slave port control circuit of the dual-port, folded-bitline DRAM architecture system of FIG. 2.
Figure 6:
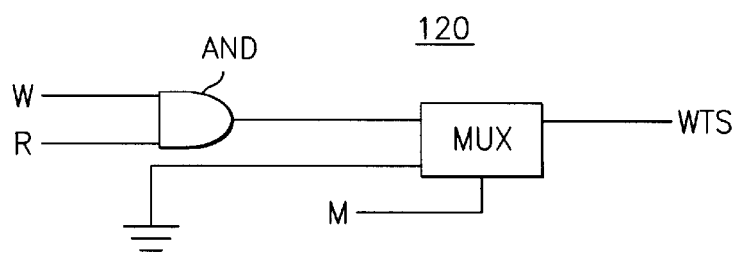
FIG. 6 is a schematic diagram of a master port control circuit of the dual-port, folded-bitline DRAM architecture system of FIG. 2.

The two control circuits 120, 140 for the master port 102 and the slave port 104, respectively, are shown schematically by FIGS. 5 and 6. The slave port control circuit 140 has five input nodes for receiving five different input signals. These signals include a write request signal W, a read request signal R, a refresh request signal F, the slave port control signal RAS, and a match signal M. The write and read request signals are received from external circuitry, such as a processor, for performing write and/or read operations. The slave port control signal RAS, as indicated above, is also received from external circuitry, such as a processor.

The match signal M is provided by the comparator 156 of a priority circuit as described below with reference to FIG. 7. The slave port control circuit 140 also has one output node for transmitting a slave port output signal SS to slave port circuitry, such as the slave row decoder 128 and slave wordline driver 130, for allowing or canceling access to the slave port 104, in accordance with the logic value of the match signal M. The slave row decoder 128 is connected to the slave wordline driver 130 for driving the slave port wordlines (WLS), as known in conventional DRAM circuit design.

With reference to FIG. 6, the master port control circuit 120 includes three input nodes for receiving the write request signal W, the read request signal R, and the match signal M. The master port control circuit 120 further includes an output node for transmitting a write-through signal WTS to master control circuitry, such as the master row decoder 108, the master wordline driver 110, and the I/O buffer 122, for simultaneously performing a write and read access. The master row decoder 108 is connected to the master wordline driver 110 for driving the master port wordlines (WLM), as known in conventional DRAM circuit design.

The operation of the master port and slave port control circuits 120, 140 will now be described with continued reference to FIGS. 5 and 6, and to the priority circuit 170 shown by FIG. 7 which includes the comparator 156, and the master port and slave port control circuits 120, 140. The priority circuit 170 uses three task request signals, i.e., the write request signal W, the read request signal R, and the refresh request signal F, to determine whether the slave port output signal SS outputted by the slave port control circuit 140 and the write-through signal WTS outputted by the master port control circuit 120 should be a logic high or a logic low.

The slave port control circuit 140 is designed to transmit a logic high slave port output signal SS to slave port control circuitry, such as the slave row decoder 128 and slave wordline driver 130, when the master and slave row addresses inputted into the comparator 156 are different to allow simultaneous access to both the master port 102 and slave port 104. Further, the slave port control circuit 140 is designed to transmit a logic low slave port output signal SS when the row addresses selected by the master row decoder 108 and slave row decoder 128 are identical or match, since the task requested through the master port 102 has a higher or equal priority to the task requested through the slave port 104 according to the traffic rules.

The master and slave row addresses are extracted from master and slave addresses received by the master row/column address buffer 118 and the slave row/column address buffer 138, respectively, from external circuitry, such as a processor, as known in the art. For example, when the external circuitry requires access to the DRAM data array 106 to write and/or read data to and from a memory cell therein.

Accordingly, after the comparator 156 of the priority circuit 170 compares the master and slave row addresses, a logic high match signal M is transmitted to the master port and slave port control circuits 120, 140, if the row addresses are identical, and the slave port control signal RAS is disabled. As a result, the slave port control circuit 140 transmits a logic low slave port output signal SS to the slave port circuitry to cancel access to the slave port 104, and hence, cancel the task scheduled to be performed through the slave port 104 to avoid data integrity problems. Access to the master port 102 is never canceled, and hence, the task scheduled to be performed through the master port 102 is never canceled. This task is thereby subsequently performed.

Figure 7:
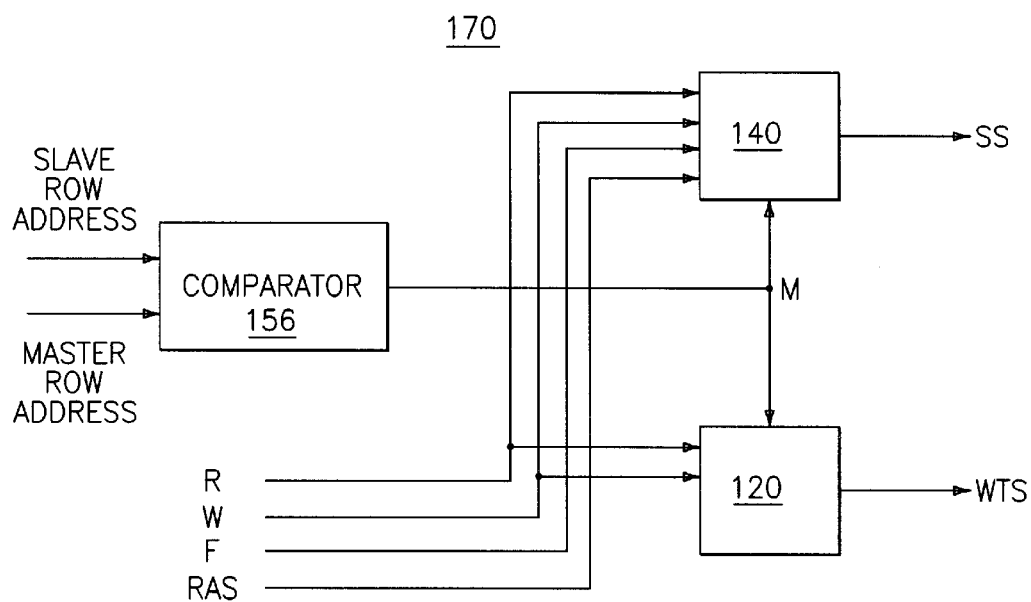
FIG. 7 is a schematic diagram of a priority circuit of the dual-port, folded-bitline DRAM architecture system of FIG. 2.

In essence, the priority circuit 170, shown by FIG. 7, prioritizes the tasks scheduled to be performed, where the tasks scheduled to be performed through the master port 102 are given a higher priority over the tasks scheduled to be performed through the slave port 104 when the row addresses are identical. However, if the task scheduled to be performed through the master port 102 is a write access and the task scheduled through the slave port 104 is a read access, then the tasks are performed simultaneously by writing to the DRAM cell 160 through the master port 102 and simultaneously writing through to the output data bus 154. The read access request slated through the slave port 104 is canceled.

At the slave port control circuit 140, the write request signal W is inputted through a first inverter INV1. The output of the inverter INV1 is inputted to a first and a second AND gate, AND1, AND2. The output of the first AND gate, AND1, is inputted to a top input of multiplexer MUX1. The read request signal R is inputted to the first AND gate, AND1, a bottom input of the multiplexer MUX1, and a second inverter INV2. The output of the second inverter INV2 is inputted to the second AND gate, AND2. The output of the second AND gate, AND2, is inputted to a top input of the multiplexer MUX2. The refresh request signal F is inputted to the second AND gate, AND2, and a bottom input of the multiplexer MUX2.

The output of the multiplexer MUX1 is inputted to a third AND gate, AND3. The output of the multiplexer MUX2 is inputted to a fourth AND gate, AND4. The slave port control signal RAS is inputted to the third and fourth AND gates, AND3, AND4. The output of the third and fourth AND gates, AND3, AND4 is inputted to an OR gate, which outputs the slave port output signal SS.

With respect to the master port control circuit 120, as shown by FIG. 6, the write and read request signals are inputted to an AND gate, AND. The output of the AND gate, AND, is inputted to a top input of a multiplexer MUX. A bottom input of the multiplexer MUX, is tied to ground. The output of the multiplexer MUX, is the write-through signal WTS.

As described above, based on the logic level of the match signal M, the output of the multiplexers MUX, MUX1, MUX2 is either the top input or the bottom input. The three multiplexers MUX, MUX1, MUX2 receive the match signal M transmitted by the comparator 156. Hence, the match signal M becomes a control signal for the multiplexers MUX, MUX1, MUX2. If the match signal M is a logic high signal, i.e., the row addresses are identical, the top input of multiplexers MUX, MUX1, MUX2 is outputted. If the match signal M is a logic low signal, i.e., the row addresses are not identical, the bottom input of multiplexers MUX1, MUX2 is outputted.

Table 1 shows the input configurations for the write request signal W, the read request signal R, and the refresh request signal F, and the outputs of the multiplexers MUX1, MUX2 (including the output of the multiplexer MUX of the master port control circuit 120, i.e., the write-through signal WTS) for a logic high and a logic low match signal M. Table 1 also shows the logic level of the slave port control signal RAS and the slave port output signal SS.

TABLE 1

Write, read and refresh request input configurations, multiplexer outputs, and logic levels of the slave port control signal RAS and the slave port output signal SS.

| M | W | R | F | MUX1 Output | MUX2 Output | MUX Output | RAS | SS | WTS |
|---|---|---|---|---|---|---|---|---|---|
| 0 | 1 | 0 | 1 | 0 | 1 | 0 | 1 | 1 | 0 |
| 0 | 1 | 1 | 0 | 1 | 0 | 0 | 1 | 1 | 0 |
| 1 | 1 | 0 | 1 | 0 | 0 | 0 | 0 | 0 | 0 |
| 1 | 1 | 1 | 0 | 0 | 0 | 1 | 0 | 0 | 1 |

It is noted that since a read request and a refresh request cannot be simultaneously performed by the slave port 104, when the read request signal R is a logic high, the refresh request signal F is a logic low, and vice versa. Also, it can be observed from Table 1 that when the match signal M is a logic low signal, the slave port control signal RAS is enabled, and when the match signal M is a logic high signal, the slave port control signal RAS is disabled to output a logic high or a logic low slave port output signal SS, respectively. That is, if the master and slave row addresses are not identical, the task requested through the slave port 104 and the task requested through the master port 102 are performed simultaneously. If the master and slave row addresses are identical, the task requested through the master port 102 takes precedence, unless it is a write-read request, where both tasks are performed simultaneously due to a high write-through signal WTS, as described below.

Table 1 does not show any input configurations where only one of the request signals is a logic high signal, because if this occurs, there can be no address collisions and the master and slave port control circuits 120, 140 are not accessed.

In the case of a write-read request as shown by the last row of Table 1, i.e., when both a write and a read request are simultaneously requested via the same row address to be performed through the master and slave ports 102, 104, respectively, the master port control circuit 120, shown by FIG. 6, outputs a high write-through signal WTS. This is accomplished by inputting the write request signal W and the read request signal R to the AND gate, AND. Since the write request signal W and the read request signal R are logic high signals when a write-read access request is made, the output of the AND gate, AND, is a logic high signal. Since the match signal M is a logic high signal, the top input of the multiplexer MUX is outputted, i.e., a logic high write-through signal WTS, to system control circuitry, in order for the system 100 to simultaneously perform both access requests. As described above, the system 100 is designed to write the data to the DRAM cell 160 and simultaneously write the data through to the output data bus 154 to simultaneously perform both access requests.

If the row address are not identical, the comparator 156 outputs a logic low match signal M to the multiplexer MUX and the multiplexer MUX outputs the bottom input. Since the bottom input of the multiplexer MUX is tied to ground, the output of the multiplexer MUX is a logic low signal, i.e., a logic low write-through signal WTS is outputted, as shown by the first and second rows of Table 1.

In conclusion, since the dual-port, folded-bitline DRAM architecture system 100 inputs the task request signals and the slave port control signal RAS within the priority circuit 170, when an address collision occurs, the system 100 maintains data integrity, while maintaining a smooth, simultaneous dual-port operation.

II. Dual-port, Shared-address Bus DRAM Architecture System

A. System Configuration and Suppressing Noise Due to the Coupling Effect

Figure 8:
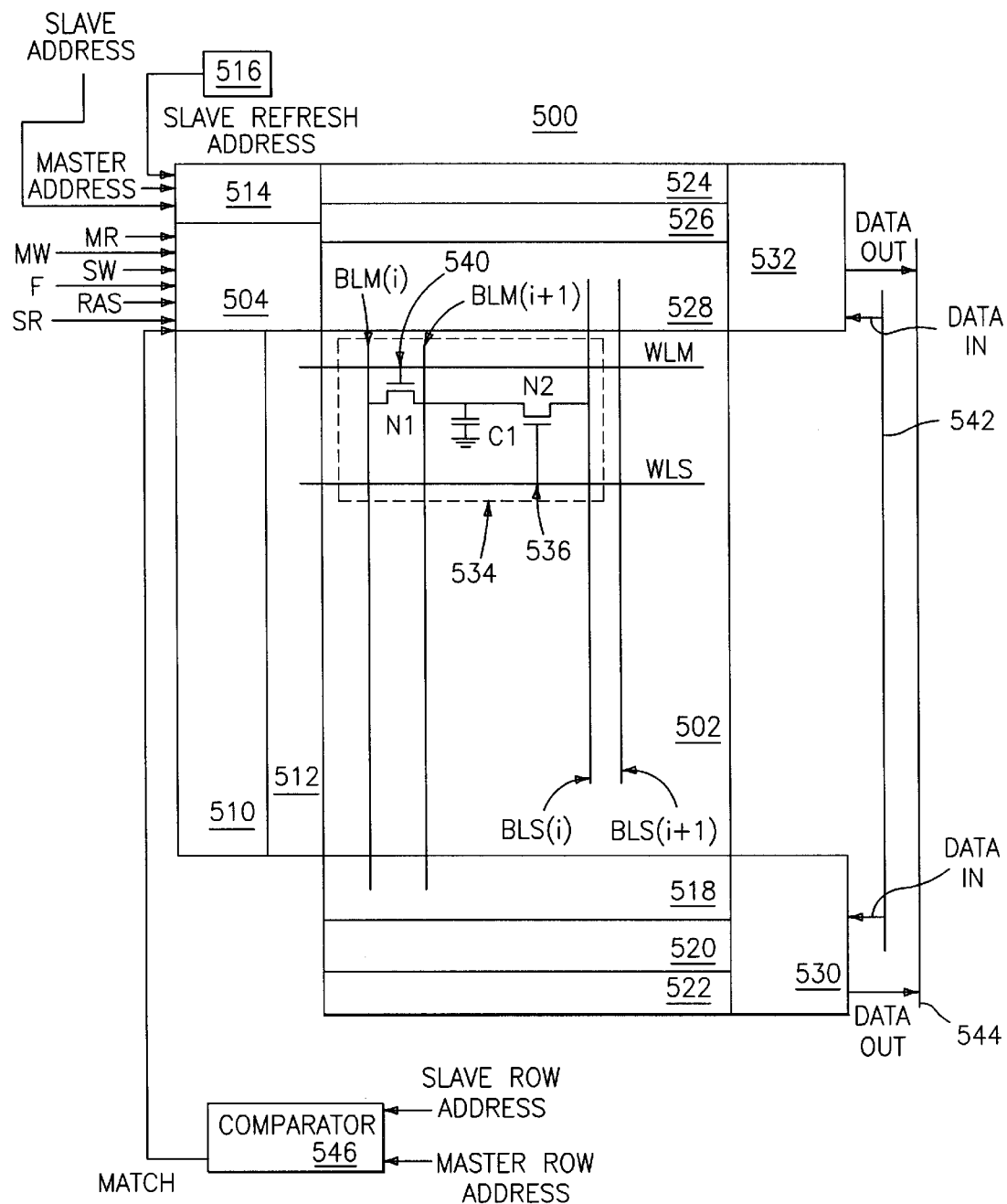
FIG. 8 is a diagram of a dual-port, shared-address bus DRAM architecture system according to the present invention.

The dual-port, shared-address bus DRAM architecture system will now be described with reference to FIGS. 8–12. The overall system is shown by FIG. 8 and designated generally by reference numeral 500. The system 500 is similar in structure and operation to the dual-port folded-bitline architecture system 100, except for the fact that the master and slave row decoders 108, 128, the master and slave wordline drivers 110, 130, the master and slave port circuits 120, 140, and the master and slave row/column address buffers 118, 138 have been combined in order for the address buses within these components to be shared as known in DRAM circuit design and as described below with respect to the master and slave port circuits. Hence, less control circuitry is required and all of the control circuitry can be provided at one side of a data array 502. Accordingly, the fabrication cost and the amount of surface area used in implementing the system 500 are decreased.

The combined components include a master/slave port control circuit 504 having a master port control circuit 506 (FIG. 11) and a slave port control circuit 508 (FIG. 10), a master/slave row decoder 510, a master/slave wordline driver 512, and a master/slave prefetch address buffer 514 capable of receiving a slave refresh address from a refresh address generator 516, and a slave address and a master address from external circuitry, such as an external processor.

The components of the system 500 which are analogous in structure and operation to components of the system 100, and prior art DRAM architecture systems, are a master column decoder 518, a master I/O switch 520, a master sense amplifier 522, a slave column decoder 524, a slave I/O switch 526, a slave sense amplifier 528, and an I/O buffer 530. Another I/O buffer 532 is included for the slave ports which is different than the output buffer 142, since, unlike system 100, data can be written to a DRAM cell 534 of system 500 through its slave port 536.

However, similarly to system 100, data can be refreshed and read through the slave port 536 and data can be written and read through a master port 540 of each DRAM cell. The data is received by and transmitted from the DRAM cell 534 via the two I/O buffers 530, 532 and input/output data buses 542, 544.

Since each DRAM cell is a dual-port DRAM cell, as shown by the DRAM cell 534, each one contains, besides the master and slave ports 540, 536, two transfer transistors N1 and N2, and one storage capacitor C1.

The system 500 further includes a comparator 546 for receiving a slave row address and a master row address and comparing the addresses to determine if they are identical. As further described below with reference to FIG. 12, the comparator 546 is part of a priority circuit 548 which includes the master port and slave port control circuits 506, 508 for prioritizing data access requests between the master and slave ports 540, 536.

The data array 502 can be similar in structure to the data array 106 (FIG. 3A) or 106A (FIG. 3B) of the dual-port, folded-bitline DRAM architecture system 100. Therefore, similarly to system 100, the system 500 suppresses noise due to wordline-to-bitline coupling, bitline-to-bitline coupling, and bitline-to-substrate coupling by providing at least a complementary bitline on the data array 502 for each true bitline to form bitline pairs. Accordingly, every bitline pair, for example master bitline pair BLM(i), BLM(i+1) and slave bitline pair BLS(i), BLS(i+1), is coupled to its corresponding master sense amplifier circuit 518 or slave sense amplifier circuit 528. Further, each bitline and wordline are coupled to the same capacitors having approximately the same capacitance as their corresponding capacitors within data array 106. Hence, the data array 502 is similar in structure to data array 106, except for the fact that each wordline, for example all master wordlines WLM and slave wordlines WLS, are coupled to the master/slave wordline driver 512 located on one side of the data array 502.

Preferably, the system 500 includes the data array 106A having twisted bitlines, as shown by FIG. 3B, since, as described above, this data array is capable of suppressing noise due to wordline-to-bitline coupling, bitline-to-bitline coupling, and bitline-to-substrate coupling, whereas the data array 106 is only capable of suppressing noise due to wordline-to-bitline coupling and and bitline-to-substrate coupling only.

B. Maintaining Data Integrity

Since in the dual-port, shared-address bus DRAM architecture system 500 the address buses are shared, only one port can be accessed during a particular time, such as during a half cycle of a clock cycle, via a particular wordline. For example, during a first half of the clock cycle, the master port 540 is accessed and during a second half of the clock cycle, the slave port 536 is accessed. This type of access is referred to as staggered.

Figure 9:
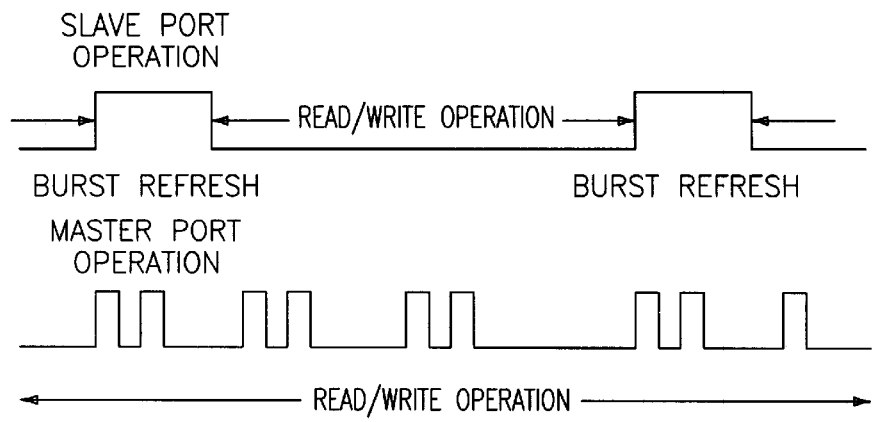
FIG. 9 is a waveform diagram of the operation of a master and a slave port of the dual-port, shared-address bus DRAM architecture system of FIG. 8.

With reference to the waveform diagrams of FIG. 9, during the refresh mode, e.g., at a time when a burst (or distributed) refresh access occurs, the slave port 536 is not available. When the slave port 536 is not in the refresh mode, the slave port 536 becomes available for a read or write access. A read or write access can be performed by the master port 540 at any time. Hence, unlike system 100, a write access can be performed through the master and slave ports 540, 536 in system 500.

Further, just as with the dual-port, folded bitline DRAM architecture system 100, the dual-port, shared address bus DRAM architecture system 500 can also be described as behaving like an SRAM architecture system, because like the SRAM system, one port is always randomly accessible for a read or write access, while a refresh access is hidden, i.e., the refresh access can be performed at any time without requiring a specific refresh request from an external controller.

The master port and slave port control circuits 506, 508 for the dual-port, shared-address bus DRAM architecture system 500 are designed to operate according to the following five traffic rules:

1. If a DRAM cell is accessed via a wordline through the master port 540 for a read or write operation, then following the read or write operation, the DRAM cell is refreshed through the slave port 536 via the same wordline. Therefore, a simultaneous refresh request slated through the slave port 536 is canceled;
2. If the DRAM cell is accessed via two ports of the same row address wordlines for simultaneously performing write and read operations based upon a write access request slated through the master port 540 and a read access request slated through the slave port 536, it is always desirable, that the most recent data written in the DRAM cell is read out. Therefore, the data is written to the DRAM cell through the master port 540. While the data is being written to the DRAM cell, the system 500 writes the data through to the output data bus 544 via at least the I/O buffer 530. That is, as the data is received by the I/O buffer 530 via the input data bus 542, if the data is to be written to the output data bus 544, the I/O buffer 530 transmits the data to the output data bus 544 while simultaneously transmitting the data to the DRAM cell. Accordingly, the data is simultaneously written to the DRAM cell and to the data bus 544 to satisfy the write and read requests. Since the read request is satisfied, the read request slated through the slave port 536 is canceled;
3. If the DRAM cell is accessed via two ports of the same row address wordline for two simultaneous read operations, the read request slated through the slave port 536 is ignored, since one read operation is adequate;
4. A write request slated through the slave port 536 has a higher priority than a simultaneous write request slated through the master port 540, and accordingly, the write request slated through the master port 540 is canceled. This is because the write request slated through the master port 540 occurs one-half cycle before the write request slated through the slave port 536. Accordingly, the write request slated through the slave port 536 has more recent or updated data than the data corresponding to the write request slated through the master port 540. Therefore, in order to prevent an unnecessary access through the master port 540 to perform the write request (the access is deemed unnecessary, since the data will be overwritten one-half cycle later by the write request slated through the slave port 536), the write request slated through the master port 540 is canceled; and
5. A write request slated through the slave port 536 has a higher priority than a simultaneous read request slated through the master port 540 of the same row address, and accordingly, the write request slated through the master port 540 is canceled. This rule is similar to rule number two above. That is, if the DRAM cell is accessed via two ports for simultaneously performing write and read operations to the same row address, it is always desirable, that the most recent data written in the DRAM cell is read out. Therefore, the data is written to the DRAM cell through the slave port 536. While the data is being written to the DRAM cell, the system 500 writes the data through to the output data bus 544 via the I/O buffer 532. That is, as the data is received by the I/O buffer 532 via the input data bus 542, if the data is to be written to the output data bus 544, the I/O buffer 532 transmits the data to the output data bus 544 while simultaneously transmitting the data to the DRAM cell. Accordingly, the data is simultaneously written to the DRAM cell and to the output data bus 544 to satisfy the write and read requests. Since the read request is satisfied, the read request slated through the master port 540 is canceled.

Figure 10:
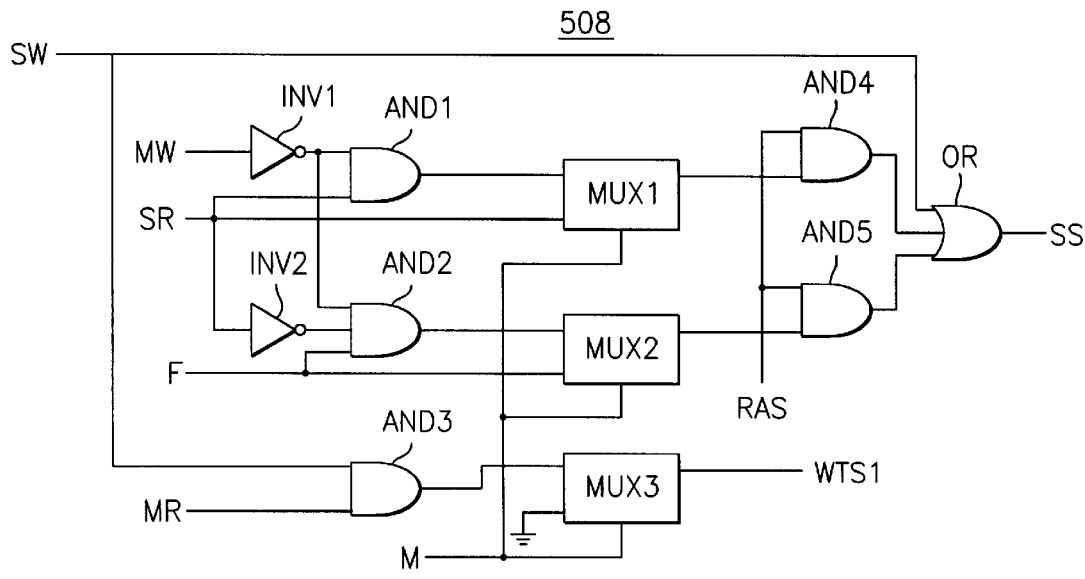
FIG. 10 is a schematic diagram of a slave port control circuit of the dual-port, shared-address bus DRAM architecture system of FIG. 8.
Figure 11:
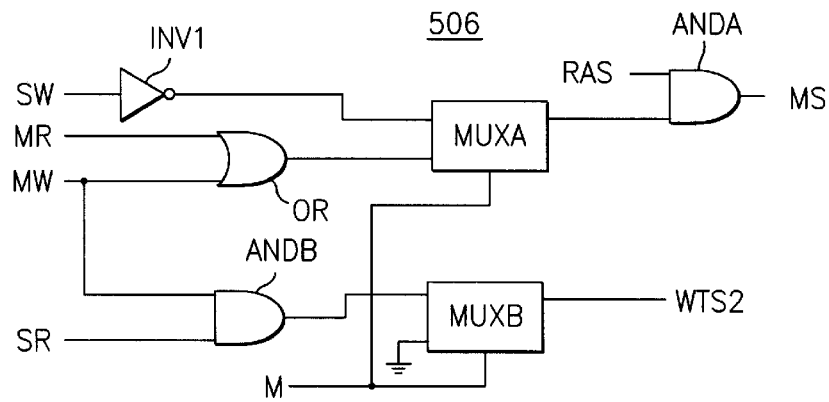
FIG. 11 is a schematic diagram of a master port control circuit of the dual-port, shared-address bus DRAM architecture system of FIG. 8.

The two control circuits 508, 506 for the slave and master ports 536, 540, respectively, are shown schematically by FIGS. 10 and 11. The slave port control circuit 508 has seven input nodes for receiving seven different input signals. These signals include a slave write request signal SW, a master read request signal MR, a slave read request signal SW, a refresh request signal F, a slave port control signal RAS, a master write request signal MW, and a match signal M. The slave write, master write, slave read, and master read request signals are received from an external processor, such as a central processing unit, for performing write and/or read operations. The slave port control signal RAS, as indicated above, is received from an external processor, as well.

The match signal M is provided by the comparator 546 as further described below with reference to FIG. 12. The slave port control circuit 508 also has two output nodes for transmitting a slave port output signal SS and a first write-through signal WTS1 to slave port circuitry, such as the master/slave row decoder 510, the master/slave wordline driver 512 and the I/O buffer 532, for allowing or canceling access to the slave port 536, in accordance with the logic value of the match signal M. The master/slave row decoder 510 selects one master/slave wordline driver 512 which drives one slave port wordline WLS, as known in conventional DRAM circuit design.

With reference to FIG. 11, the master port control circuit 506 includes six input nodes for receiving the slave write request signal SW, the master write request signal MW, the slave read request signal SR, the master read request signal MR, the slave port controls signal RAS, and the match signal M. The master port control circuit 506 further includes two output nodes for transmitting a master port output signal MS and a second write-through signal WTS2 to master control circuitry, such as the master/slave row decoder 510, the master/slave wordline driver 512, and the master I/O buffer 530, for allowing or canceling access to the master port 540, in accordance with the logic value of the match signal M. The master/slave row decoder 510 selects one master/slave wordline driver 512 which drives one master port wordline WLM, as known in conventional DRAM circuit design.

Figure 12:
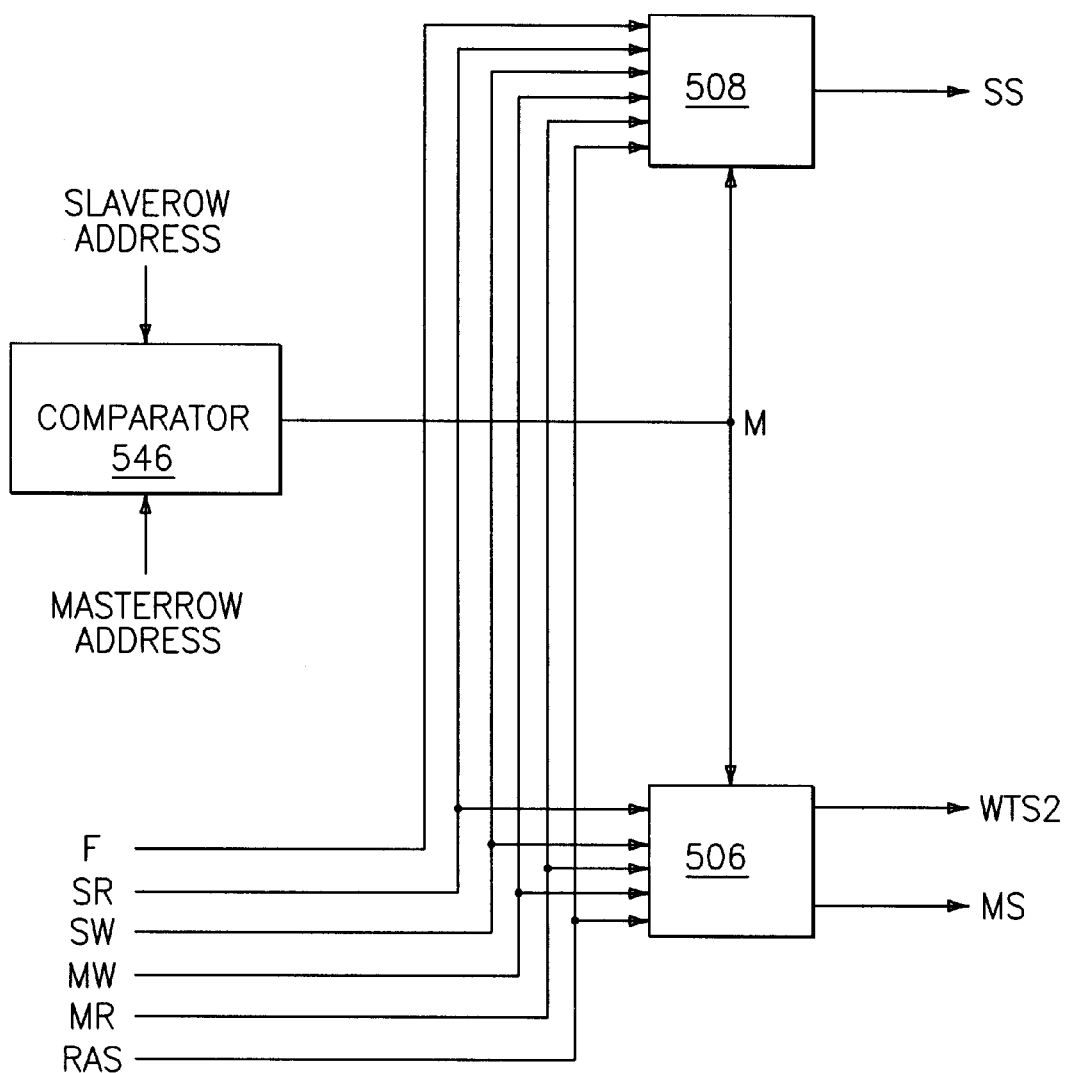
FIG. 12 is a schematic diagram of a priority circuit of the dual-port, shared-address bus DRAM architecture system of FIG. 8.

The operation of the slave port and master port control circuits 508, 506 will now be described with continued reference to FIGS. 10 and 11, and to the priority circuit 548, as shown by FIG. 12, which includes the comparator 546, and the slave port and master port control circuits 508, 506 included within the master/slave port control circuit 504, as shown by FIG. 8.

The priority circuit 548 uses five task request signals, i.e., the slave write request signal SW, the master write request signal MW, the master read request signal MR, the slave read request signal SR, and the refresh request signal F, to determine whether the slave port output signal SS outputted by the slave port control circuit 508 and the master port output signal MS outputted by the master port control circuit 506 should be a logic high or a logic low. The slave and master port control circuits 508, 506 are designed to transmit a logic high slave port output signal SS and master port output signal MS, respectively, to master/slave port control circuitry, such as the master/slave row decoder 510 and master/slave wordline driver 512, when the slave and master row addresses inputted into the comparator 546 are different to allow access to the DRAM cell 534 through the slave port 536 and master port 540.

The slave and master row addresses are extracted from the slave and master addresses received by the master/slave prefetch address buffer 514 from external circuitry.

If the master and slave row addresses are the same, i.e., the row addresses corresponds to the same row of DRAM cells as determined by the comparator 546, then the slave port control circuit 508 is designed to transmit a logic low slave port output signal SS to the slave port circuitry to cancel access to the slave port 536, since the task requested through the master port 540 has a higher or equal priority, unless the task requested through the slave port 536 is a write access request and the task requested through the master port 536 is either a read or write access request.

In particular, if the task requested through the slave port 536 is a write access request, regardless of the task requested through the master port 540, then the slave port control circuit 508 is designed to transmit a logic high slave port output signal SS to the slave port circuitry to allow access to the DRAM cell 534 through the slave port 536. If the task requested through the slave port 536 is a write access request and the task requested through the master port 540 is a read access request, then the slave port control circuit 508 is also designed to transmit a logic high write-through signal WTS1 to simultaneously perform both requests.

Accordingly, after the comparator 546 compares the master row and slave row addresses, a logic high match signal M is transmitted to the master port and slave port control circuits 506, 508, if the row addresses are identical, i.e., correspond to the same row of DRAM cells. The slave port control signal RAS is also disabled. As a result, the slave port control circuit 508 transmits a logic low slave port output signal SS to the slave port circuitry to cancel access to the slave port 536, and hence, cancel the task scheduled to be performed through the slave port 536. Access to the master port 540 is never canceled by transmitting a logic high master port output signal MS, and hence, the task scheduled through the master port 540 is performed, unless the access request slated through the slave port 536 is a write access request.

If the access request slated through the slave port 536 is a write access request, i.e., the slave write signal SW is a logic high signal, the slave port output signal SS is a logic high signal, since the logic high slave write signal SW is directly inputted to an OR gate of the slave port circuit 508 (see FIG. 10), from which the slave port output signal SS is outputted from. Accordingly, the slave port control circuitry is enabled and access is allowed through the slave port 536. At the same time, the master port control circuitry is disabled, since a logic low master port output signal MS is transmitted to the master port control circuitry from the master port control circuit 506, as further illustrated below with reference to Table 2.

In essence, the priority circuit 548 prioritizes the tasks scheduled to be performed, where the tasks scheduled to be performed through the master port 540 are given a higher or equal priority to the tasks scheduled to be performed through the slave port 536 when the row addresses are identical, unless both tasks scheduled to be performed through the slave port 536 and the master port 540 are write accesses.

At the slave port control circuit 508, the master write request signal MW is inputted through a first inverter INV1. The output of the inverter INV1 is inputted to a first and a second AND gate, AND1, AND2. The output of the first AND gate, AND1, is inputted to a top input of the multiplexer MUX1. The slave read request signal SR is inputted to the first AND gate, AND1, a bottom input of the multiplexer MUX1, and a second inverter INV2. The output of the second inverter INV2 is inputted to the second AND gate, AND2. The refresh request signal F is inputted to the second AND gate, AND2, and a bottom input of the multiplexer MUX2. The output of the second AND gate, AND2, is inputted to a top input of the multiplexer MUX2. The master read request signal MR is inputted to an input of a third AND gate, AND3.

The output of the multiplexer MUX1 is inputted to a fourth AND gate, AND4. The output of the multiplexer MUX2 is inputted to a fifth AND gate, AND5. The slave port control signal RAS is inputted to the fourth and fifth AND gates, AND4, AND5. The output of the fourth and fifth AND gates, AND4, AND5 is inputted to the OR gate, which outputs the slave port output signal SS.

The slave write request signal SW is inputted to the OR gate and the third AND gate, AND3. The output of the third AND gate, AND3, is inputted to a top input of multiplexer MUX3. A bottom input of the multiplexer MUX3 is tied to ground and the output of the multiplexer MUX3 is the first write-through signal WTS1.

As described above, based on the logic level of the match signal M, the output of the multiplexers MUX1, MUX2, MUX3 is either the top input or the bottom input, i.e., if the match signal M is a logic high signal, the top input of the multiplexers MUX1, MUX2, MUX3 is outputted, and if the match signal M is a logic low signal, the bottom input of the multiplexers MUX1, MUX2, MUX3 is outputted. The three multiplexers MUX1, MUX2, MUX3 receive the match signal M transmitted by the comparator 546. Hence, the match signal M becomes a control signal for the multiplexers MUX1, MUX2, MUX3.

At the master port control circuit 506, the slave write request signal SW is inputted to an inverter INV. The output of the inverter INV is inputted to a top input of multiplexer MUXA. The output of the multiplexer MUXA is inputted to an AND gate, ANDA. The slave port control signal RAS is also inputted to the AND gate, ANDA.

The master write request signal MW and the master read request signal MR are inputted to an OR gate, OR. The output of the OR gate, OR, is inputted to a bottom input of the multiplexer MUXA. The master read request signal MR is also inputted to an AND gate, ANDB. The slave read request signal SR is also inputted to the AND gate, ANDB. The output of the AND gate, ANDB, is inputted to a top input of multiplexer MUXB. A bottom input of the multiplexer MUXB is tied to ground and the output of the multiplexer MUXB is the second write-through signal WTS2.

Based on the logic level of the match signal M, the output of the multiplexers MUXA, MUXB is either the top input or the bottom input. The two multiplexers MUXA, MUXB receive the match signal M transmitted by the comparator 546. Hence, the match signal M becomes a control signal for the multiplexers MUXA, MUXB. If the match signal M is a logic high signal, the top input of multiplexers MUXA, MUXB is outputted by the multiplexers MUXA, MUXB. If the match signal M is a logic low signal, the bottom input of multiplexers MUXA, MUXB is outputted by the multiplexers MUXA, MUXB.

Table 2 shows the input configurations for the slave write request signal SW, the master write request signal MW, the read request signal R, and the refresh request signal F, the outputs of the multiplexers MUX1, MUX2, MUX3, MUXA, MUXB and the outputs of the slave port and master port control circuits 508, 506, i.e., the slave port output signal SS, the master port output signal MS, and the first and second write-through signals WTS1, WTS2, for a logic high and a logic low match signal M.

if this occurs, there can be no address collisions and the master and slave port control circuits 506, 508 are not accessed.

Additionally, it is noted that Table 2 takes into consideration that when the match signal M is a logic low signal, the slave port control signal RAS is enabled, and when the match signal M is a logic high signal, the slave port control signal RAS is disabled.

According to Table 2, when the master and slave row addresses are not identical, the task requested through the slave port 536 and the task requested through the master port 540 are performed simultaneously by outputting a logic high slave port output signal SS and a logic high master port output signal MS.

In the case of a write-slave read request, i.e., when both a write and a read request are simultaneously requested via the same row address to be performed through the master and slave ports 540, 536, respectively, the slave port control circuit 508, shown by FIG. 10 outputs a low write-through signal WTS1, and the master port control circuit 506, shown by FIG. 11, outputs a high write-through signal WTS2. In the case of a master read-slave write request, the slave port control circuit 508 outputs a high write-through signal WTS1, and the master port control circuit 506 outputs a low write-through signal WTS2. The write-through signals WTS1, WTS2 allow the system 500 to simultaneously perform a write and read access request. This is accomplished by simultaneously writing the data to the DRAM cell 160 and writing the data through to the output data bus 544 to simultaneously perform both requests.

In conclusion, since the dual-port, shared-address bus DRAM architecture system 500 inputs the task request

TABLE 2

Slave write, master write, read and refresh request input configurations, the outputs of the multiplexers, and slave port and master port control circuit outputs for a logic low and a logic high match signal.

| M | SW | MW | MR | SR | F | MUX1 Output | MUX2 Output | MUX3 Output | MUXA Output | MUXB Output | SS | MS | WTS1 | WTS2 |
|---|----|----|----|----|---|-------------|-------------|-------------|-------------|-------------|----|----|------|------|
| 0 | 0  | 1  | 0  | 0  | 1 | 0           | 1           | 0           | 1           | 0           | 1  | 1  | 0    | 0    |
| 0 | 0  | 1  | 0  | 1  | 0 | 1           | 0           | 0           | 1           | 0           | 1  | 1  | 0    | 0    |
| 0 | 1  | 0  | 1  | 0  | 0 | 0           | 0           | 0           | 1           | 0           | 1  | 1  | 0    | 0    |
| 0 | 1  | 1  | 0  | 0  | 0 | 0           | 0           | 0           | 1           | 0           | 1  | 1  | 0    | 0    |
| 1 | 0  | 1  | 0  | 0  | 1 | 0           | 0           | 0           | 1           | 0           | 0  | 1  | 0    | 0    |
| 1 | 0  | 1  | 0  | 1  | 0 | 0           | 0           | 0           | 1           | 1           | 0  | 1  | 0    | 1    |
| 1 | 1  | 0  | 1  | 0  | 0 | 1           | 0           | 1           | 0           | 0           | 1  | 0  | 1    | 0    |
| 1 | 1  | 1  | 0  | 0  | 0 | 0           | 0           | 0           | 0           | 0           | 1  | 0  | 0    | 0    |

It is noted that since a slave write request, a slave read request and a refresh request cannot be simultaneously performed by the slave port 536 (see FIG. 9), if either the slave write request signal SW, the slave read request signal SR or the refresh request signal F is a logic high signal, the other two signals are logic low signals. In other words, the slave write request signal SW, the slave read request signal SR, and the refresh request signal F are mutually exclusive signals, since only one access request can be made through the slave port 536 at a particular time.

Further, it is noted that when the slave write request signal SW is a logic high signal, the master write request signal MW and the master read request signal MR cannot both be logic high signals. Further still, it is noted that when the master write request signal MW is a logic high signal, the slave write request signal SW and the slave read request signal SR cannot both be logic high signals.

Table 2 does not show any input configurations where only one of the request signals is a logic high signal, because signals and the slave port control signal RAS within the priority circuit 548, when an address collision occurs, the system 500 maintains data integrity, while maintaining a smooth, simultaneous dual-port operation.

What has been described herein is merely illustrative of the application of the principles of the present invention. For example, the functions described above and implemented as the best mode for operating the present invention are for illustration purposes only. As a particular example, for instance, other design configurations may be used for the master and slave port control circuits which provide similar operation as the circuits described above. Other arrangements and methods may be implemented by those skilled in the art without departing from the scope and spirit of this invention.

We claim:

1. A memory system comprising:
   a plurality of dynamic random access memory (DRAM) cells arranged in an array, each of the DRAM cells having a corresponding first port and a corresponding second port, each first and second port enabling access to the corresponding DRAM cell; and a first and a second pair of bitlines for each of the DRAM cells, where the first pair couples said first port of each of the DRAM cells to a first sense amplifier circuit and the second pair couples said second port of each of the DRAM cells to a second sense amplifier circuit, and the first and second pair of bitlines are arranged in a folded-bitline architecture.

2. The memory system according to claim 1, wherein the first and second pair of bitlines are arranged in a twisted configuration.

3. The memory system according to claim 1, further comprising a pair of wordlines for each of the DRAM cells, where a first wordline of the pair of wordlines connects said first port to a first wordline driver circuit and a second wordline of the pair of wordlines connects said second port to a second wordline driver circuit.

4. The memory system according to claim 3, wherein said first and second wordline driver circuits are located on opposite sides of the array.

5. The memory system according to claim 3, wherein said first and second wordline driver circuits are located on the same side of the array.

6. The memory system according to claim 1, further comprising a traffic control system for prioritizing first and second simultaneous access requests for accessing the corresponding DRAM cell, where the first access request requests access to the corresponding DRAM cell through said first port and the second access request requests simultaneous access to the corresponding DRAM cell through said second port.

7. The memory system according to claim 6, wherein said traffic control system includes a first port control circuit and a second port control circuit for controlling access to the corresponding DRAM cell through said first and second ports, respectively.

8. The memory system according to claim 6, wherein said traffic control system includes a comparator for receiving a first port row address and a second port row address and determining if said first port row address and said second port row address correspond to the corresponding DRAM cell.

9. The memory system according to claim 8, wherein said comparator includes an output node for transmitting a signal to said first port control circuit and said second port control circuit indicating if said first port row address and said second port row address correspond to the corresponding DRAM cell.

10. The memory system according to claim 9, wherein if said signal indicates that said first port row address and said second port row address correspond to the same row of DRAM cells as the corresponding DRAM cell in the array, a logic low second port control signal is transmitted to said second port control circuit to cause said second port control circuit to transmit a logic low signal to second port control circuitry to prevent access through said second port to the corresponding DRAM cell, otherwise a logic high second port control signal is transmitted to said second port control circuit to cause said second port control circuit to transmit a logic high signal to said second port control circuitry to allow access through said second port to the corresponding DRAM cell.

11. The memory system according to claim 9, wherein said signal has a logic high level if said first port row address and said second port row address correspond to the corresponding DRAM cell, otherwise said signal has a logic low level.

12. The memory system according to claim 9, wherein said signal is received by at least one multiplexer of said first port control circuit and at least one multiplexer of said second port control circuit, said signal being a control signal for each multiplexer.

13. The memory system according to claim 1, further comprising:

a first wordline driver circuit coupled to said first port of each of the DRAM cells; and a second wordline driver circuit coupled to said second port of each of the DRAM cells.

14. The memory system according to claim 13, wherein said first wordline driver circuit and said second wordline driver circuit are located on opposite sides of the array.

15. The memory system according to claim 13, wherein said first wordline driver circuit and said second wordline driver circuit are located on the same side of the array.

16. The memory system according to claim 1, further comprising:

a first decoder circuit coupled to said first port of each of the DRAM cells; and a second decoder circuit coupled to said second port of each of the DRAM cells.

17. The memory system according to claim 16, wherein said first decoder circuit and said second decoder circuit are located on opposite sides of the array.

18. The memory system according to claim 16, wherein said first decoder circuit and said decoder driver circuit are located on the same side of the array.

19. A multi-port dynamic random access memory (DRAM) architecture system capable of suppressing noise due to the bitline-to-bitline coupling effect, the system comprising:

a plurality of dynamic random access memory (DRAM) cells arranged in an array, each of the DRAM cells having a corresponding first port and a corresponding second port, each first and second port enabling access to the corresponding DRAM cell; and a complementary bitline for every bitline of the array, wherein each complementary bitline traverses the array in twisted configuration with respect to a corresponding bitline, wherein, during a signal developing period and a signal sensing period, the complementary bitline is coupled to a higher voltage level and its corresponding bitline is coupled by the same amount to a lower voltage level, and vice versa, thereby canceling out the bitline-to-bitline coupling effect.

20. A method of suppressing noise due to the bitline-to-bitline coupling effect in a multi-port dynamic random access memory (DRAM) array having a plurality of DRAM cells, the method comprising the step of:

providing a complementary bitline for each bitline of the array, wherein each complementary bitline traverses the array in twisted configuration with respect to a corresponding bitline, wherein, during a signal developing period and a signal sensing period, the complementary bitline is coupled to a higher voltage level and its corresponding bitline is coupled by the same amount to a lower voltage level, and vice versa, thereby canceling out the bitline-to-bitline coupling effect.

21. A multi-port dynamic random access memory (DRAM) architecture system capable of suppressing noise due to the wordline-to-bitline coupling effect, the system comprising:

a plurality of dynamic random access memory (DRAM) cells arranged in an array, each of the DRAM cells having a corresponding first port and a corresponding second port, each first and second port enabling access to the corresponding DRAM cell;

a complementary bitline for each bitline of the array forming a plurality of complementary bitline and bitline pairs; and at least one wordline traversing the array and intersecting at least one pair of the plurality of complementary bitline and bitline pairs, wherein, during a wordline activation period, the coupling between the wordline and the bitline of the at least one pair and the wordline and complementary bitline of the at least one pair are equal, thereby canceling out the wordline-to-bitline coupling effect.

22. A method of suppressing noise due to the wordline-to-bitline coupling effect in a multi-port dynamic random access memory (DRAM) array having a plurality of DRAM cells, the method comprising the step of:

providing a complementary bitline for each bitline of the array to form a plurality of complementary bitline and bitline pairs, at least one wordline traverses the array and intersects at least one pair of the plurality of complementary bitline and bitline pairs, wherein, during a wordline activation period, the coupling between the wordline and the bitline of the at least one pair and the wordline and complementary bitline of the at least one pair are equal, thereby canceling out the wordline-to-bitline coupling effect.

23. A multi-port dynamic random access memory (DRAM) architecture system capable of suppressing noise due to the bitline-to-substrate coupling effect, the system comprising:

a plurality of dynamic random access memory (DRAM) cells arranged in an array and fabricated on a substrate, each of the DRAM cells having a corresponding first port and a corresponding second port, each first and second port enabling access to the corresponding DRAM cell; and a complementary bitline for each bitline of the array forming a plurality of complementary bitline and bitline pairs, one of the bitlines of each pair couples the substrate to a higher voltage level and the other bitline of each pair couples the substrate by the same amount to a lower voltage level during a signal developing period and a signal sensing period, thereby canceling out the bitline-to-substrate coupling effect.

24. A method of suppressing noise due to the bitline-to-substrate coupling effect in a multi-port dynamic random access memory (DRAM) array having a plurality of DRAM cells fabricated on a substrate, the method comprising the step of:

providing a complementary bitline for each bitline of the array to form a plurality of complementary bitline and bitline pairs, one of the bitlines of each pair couples the substrate to a higher voltage level and the other bitline of each pair couples the substrate by the same amount to a lower voltage level during a signal developing period and a signal sensing period, thereby canceling out the bitline-to-substrate coupling effect.

* * * * *

UNITED STATES PATENT AND TRADEMARK OFFICE
CERTIFICATE OF CORRECTION

PATENT NO.    : 6,445,638 B1
DATED         : September 3, 2002
INVENTOR(S)   : Louis L. Hsu et al.

It is certified that error appears in the above-identified patent and that said Letters Patent is hereby corrected as shown below:

<u>Title page,</u>
Item [75], "Radens Carl" should be -- Carl Radens --.

Signed and Sealed this

Fourth Day of February, 2003

JAMES E. ROGAN
*Director of the United States Patent and Trademark Office*